(12) United States Patent
Lee et al.

(10) Patent No.: US 10,546,902 B2
(45) Date of Patent: Jan. 28, 2020

(54) FINGERPRINT SENSOR, DISPLAY DEVICE, AND METHOD OF MANUFACTURING DISPLAY DEVICE

(71) Applicant: Samsung Display Co., Ltd., Yongin-si (KR)

(72) Inventors: Sun Hwa Lee, Yongin-si (KR); Mu Kyung Jeon, Yongin-si (KR); Il Gon Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/804,077

(22) Filed: Nov. 6, 2017

(65) Prior Publication Data

US 2018/0130857 A1    May 10, 2018

(30) Foreign Application Priority Data

Nov. 7, 2016  (KR) .................... 10-2016-0147500

(51) Int. Cl.
| | | |
|---|---|---|
| H05B 33/08 | (2006.01) | |
| G06F 3/042 | (2006.01) | |
| G02F 1/33 | (2006.01) | |
| H01L 29/24 | (2006.01) | |
| H01L 27/12 | (2006.01) | |
| H01L 27/32 | (2006.01) | |
| H01L 51/52 | (2006.01) | |
| G06F 3/041 | (2006.01) | |
| G06K 9/00 | (2006.01) | |

(Continued)

(52) U.S. Cl.
CPC ........ *H01L 27/3234* (2013.01); *H01L 27/323* (2013.01); *H01L 27/3276* (2013.01); *H01L 51/5253* (2013.01); *H01L 51/5281* (2013.01); *G06F 3/041* (2013.01); *G06K 9/00013* (2013.01); *G09G 3/2092* (2013.01); *G09G 2354/00* (2013.01); *H01L 27/14678* (2013.01); *H01L 27/3246* (2013.01); *H01L 2227/323* (2013.01)

(58) Field of Classification Search
CPC ..... G06F 3/0412; G06F 3/044; G09G 3/3618; G09G 2340/0435
See application file for complete search history.

(56) References Cited

U.S. PATENT DOCUMENTS

| 2010/0007268 A1* | 1/2010 | Kim .................... H01L 27/3227 313/504 |
| 2010/0007632 A1* | 1/2010 | Yamazaki ............. G06F 1/1616 345/175 |

(Continued)

FOREIGN PATENT DOCUMENTS

KR    10-2018-0001677    1/2018

*Primary Examiner* — Brian Turner
(74) *Attorney, Agent, or Firm* — H.C. Park & Associates, PLC

(57) ABSTRACT

A display device includes a display pixel and a sensor pixel. The display pixel includes a light-emitting element including a first pixel electrode. The display pixel further includes a pixel circuit electrically coupled to the light-emitting element. The sensor pixel includes a sensor electrode overlapping the first pixel electrode. The sensor pixel further includes a sensor circuit electrically coupled to the sensor electrode. The first pixel electrode includes a first opening in a region overlapping the sensor electrode.

29 Claims, 34 Drawing Sheets

(51) Int. Cl.
    *G09G 3/20*         (2006.01)
    *H01L 27/146*     (2006.01)

(56) References Cited

U.S. PATENT DOCUMENTS

| | | | |
|---|---|---|---|
| 2012/0075558 A1* | 3/2012 | Kishida | G02F 1/133753 349/106 |
| 2014/0048783 A1* | 2/2014 | Han | C23C 14/3414 257/40 |
| 2014/0292623 A1* | 10/2014 | Moon | G09G 3/006 345/82 |
| 2015/0185888 A1* | 7/2015 | Sakashita | G06F 3/041 345/174 |
| 2016/0154263 A1* | 6/2016 | Hatsumi | G02F 1/13338 349/12 |
| 2016/0299601 A1* | 10/2016 | Yamazaki | G06F 3/044 |
| 2016/0343949 A1* | 11/2016 | Seo | C09K 11/06 |
| 2016/0349558 A1* | 12/2016 | Shishido | G02F 1/13338 |
| 2016/0370660 A1* | 12/2016 | Zhao | G02F 1/1333 |
| 2017/0031507 A1* | 2/2017 | Huang | G06F 3/044 |
| 2017/0371462 A1 | 12/2017 | Kim et al. | |

\* cited by examiner

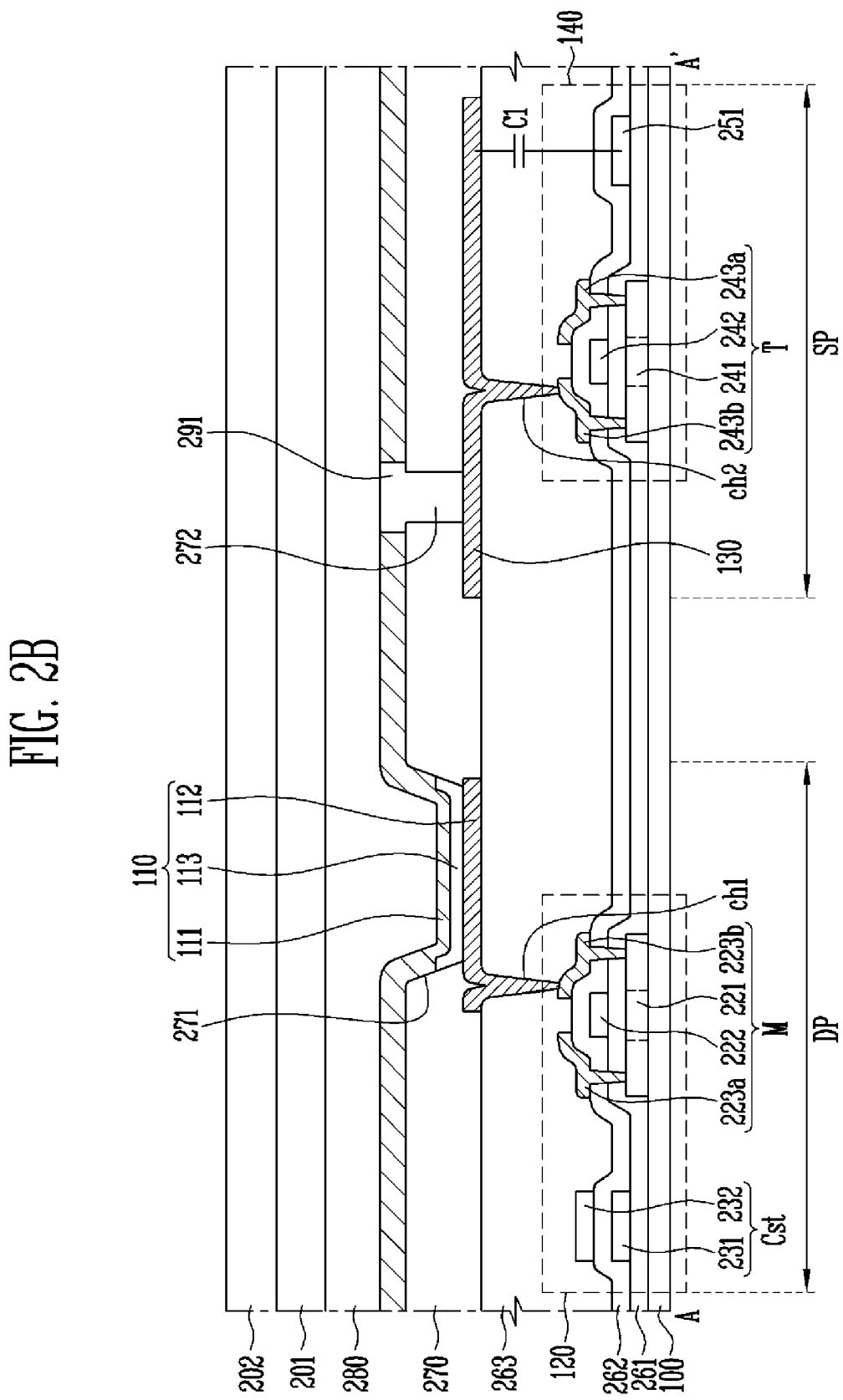

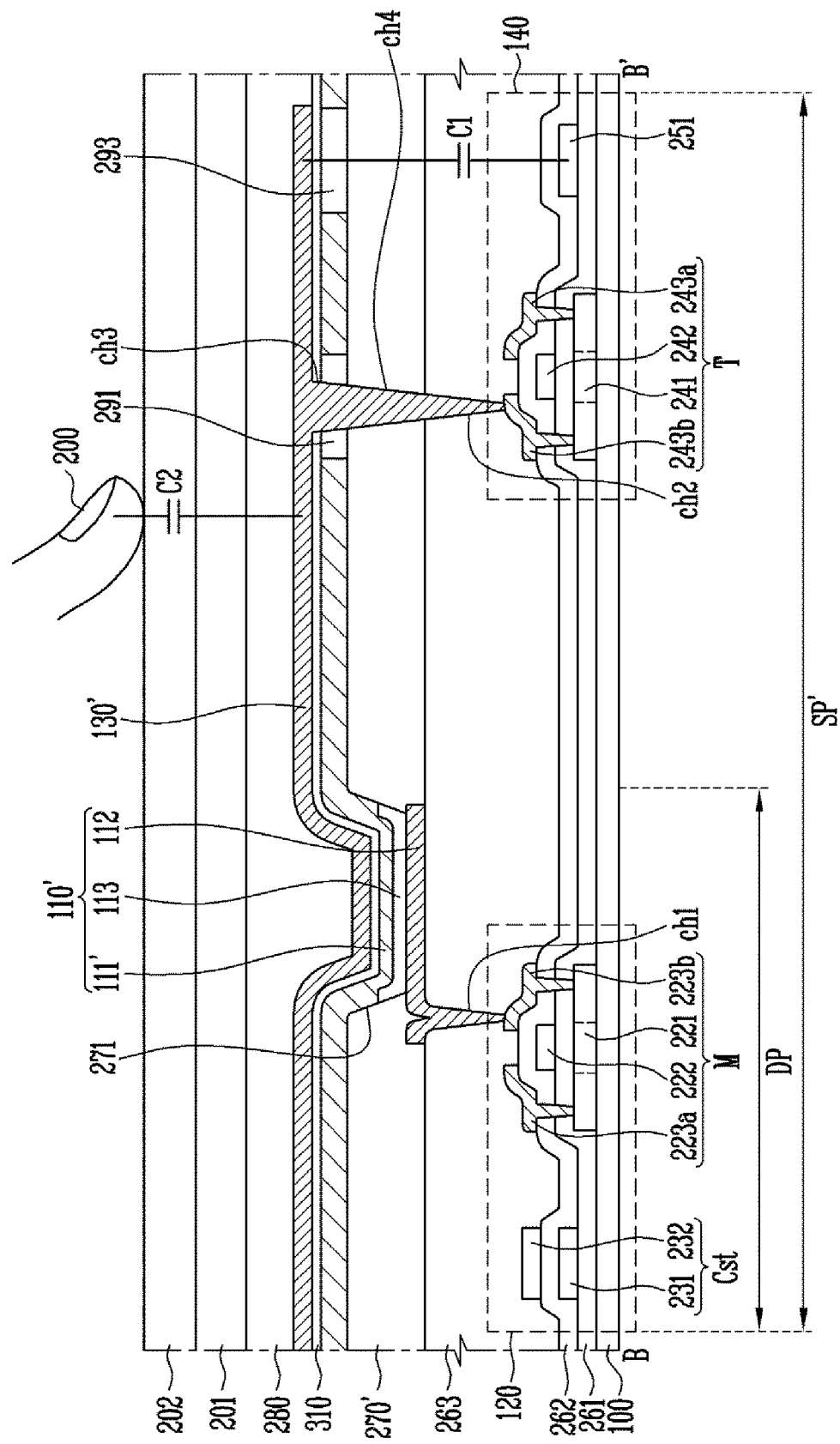

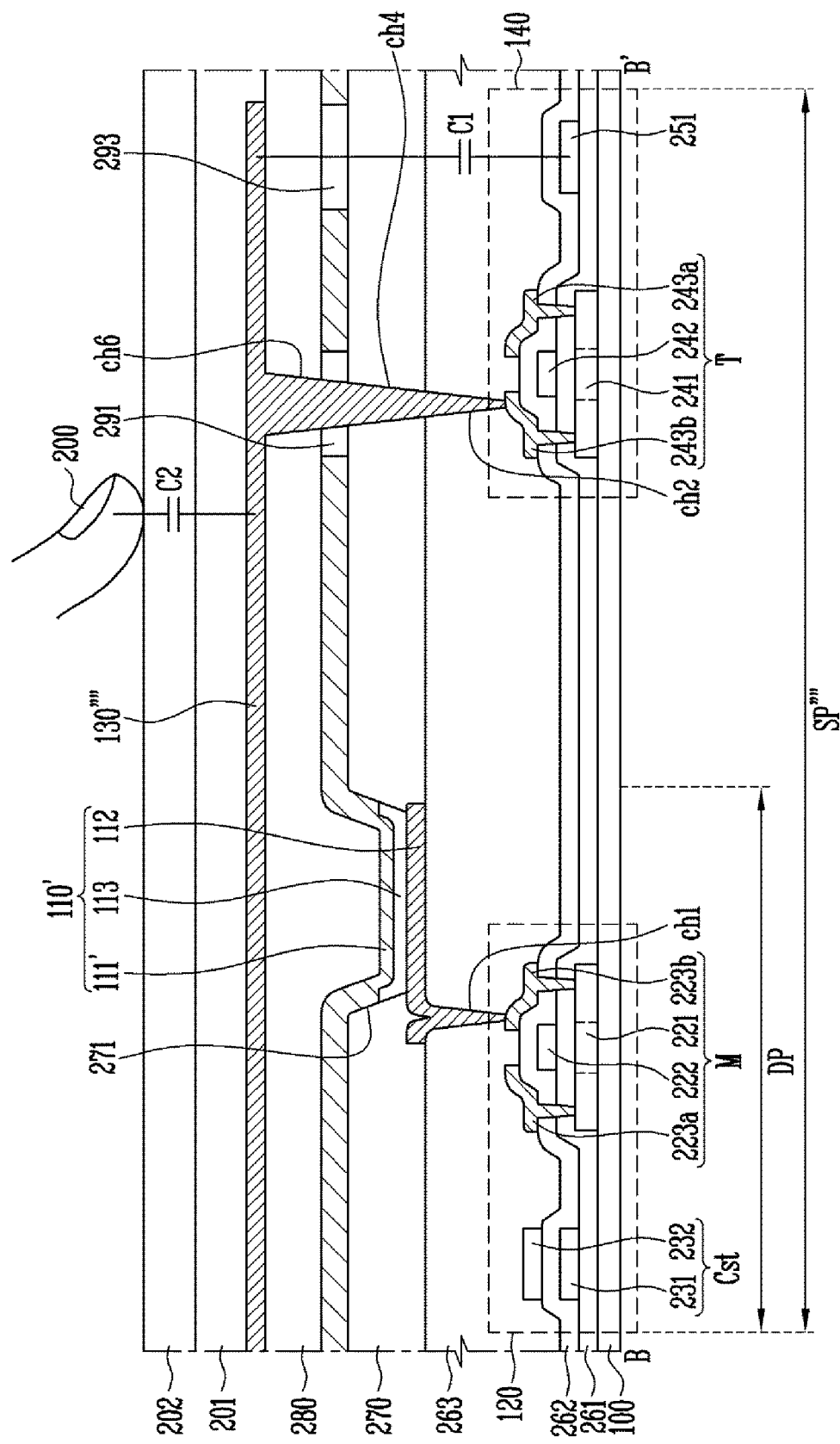

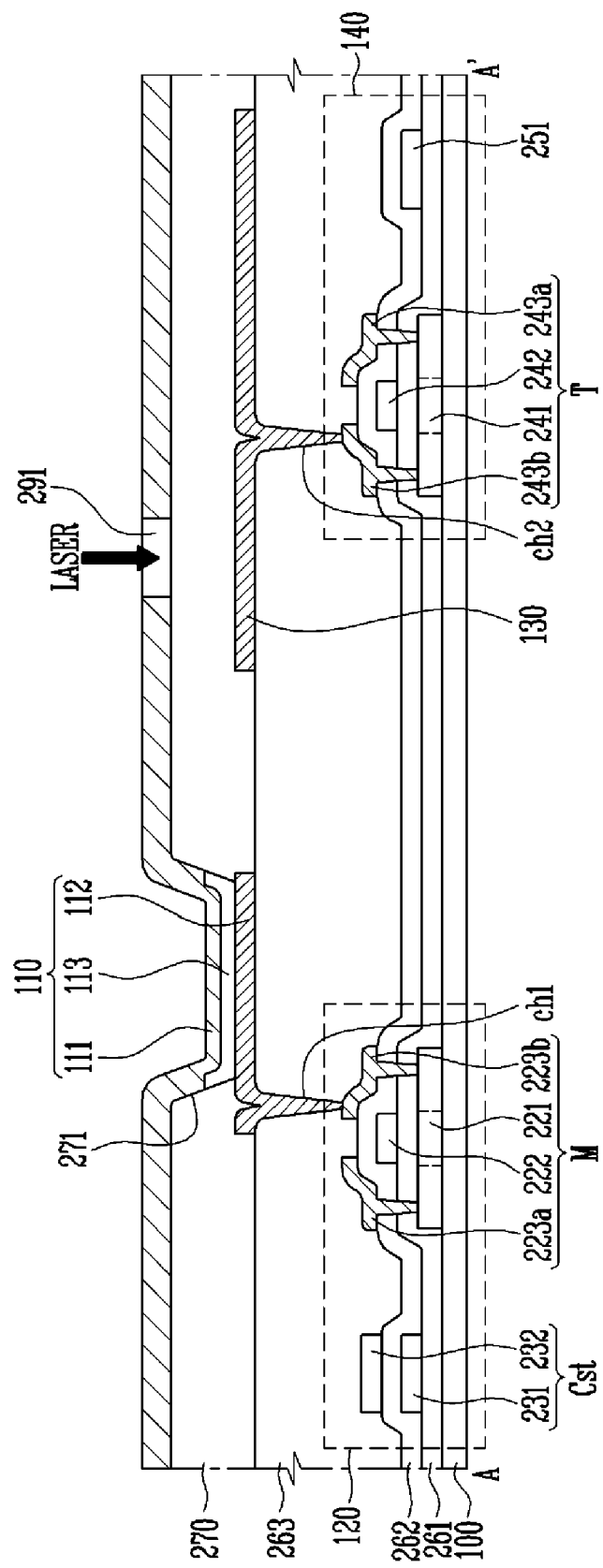

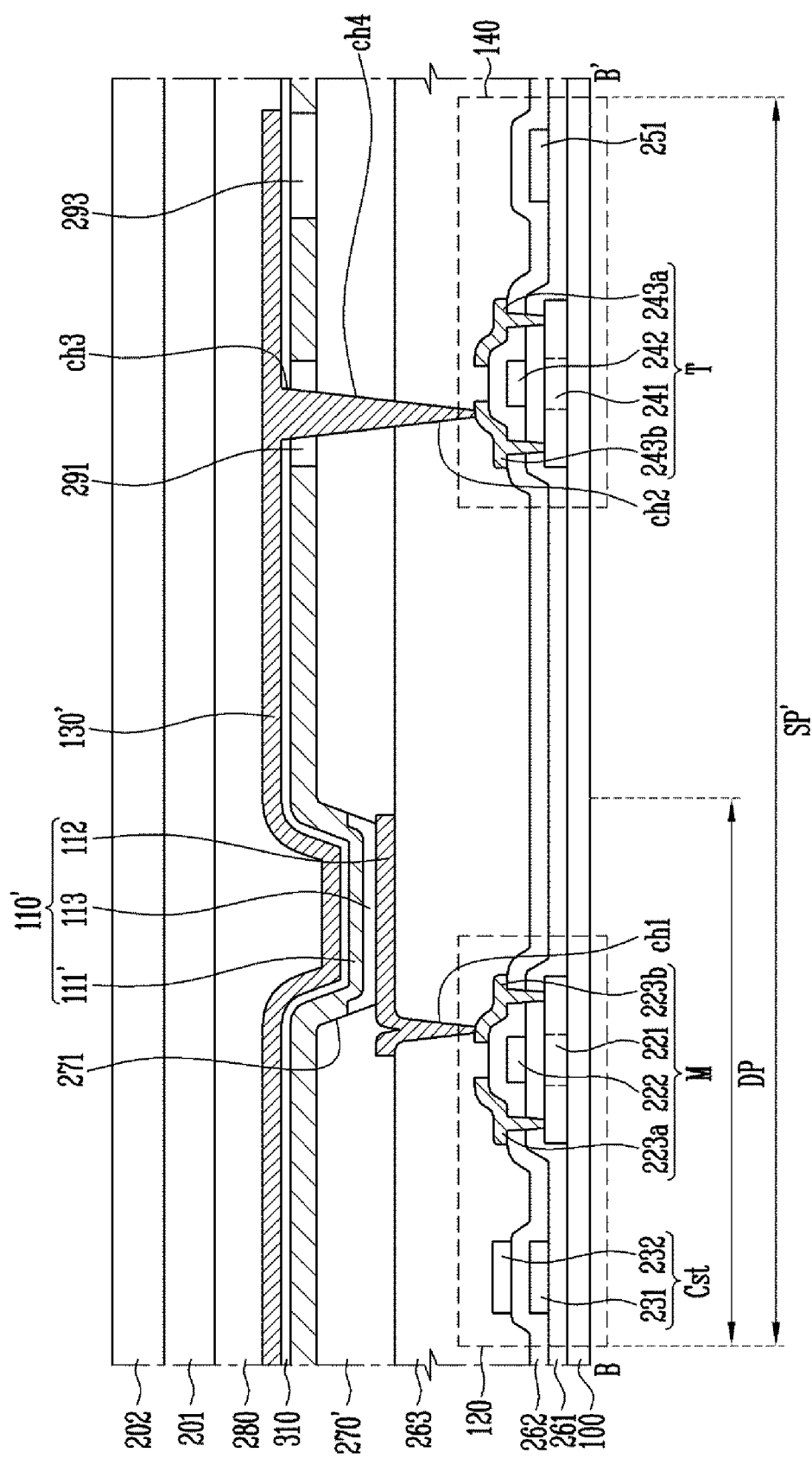

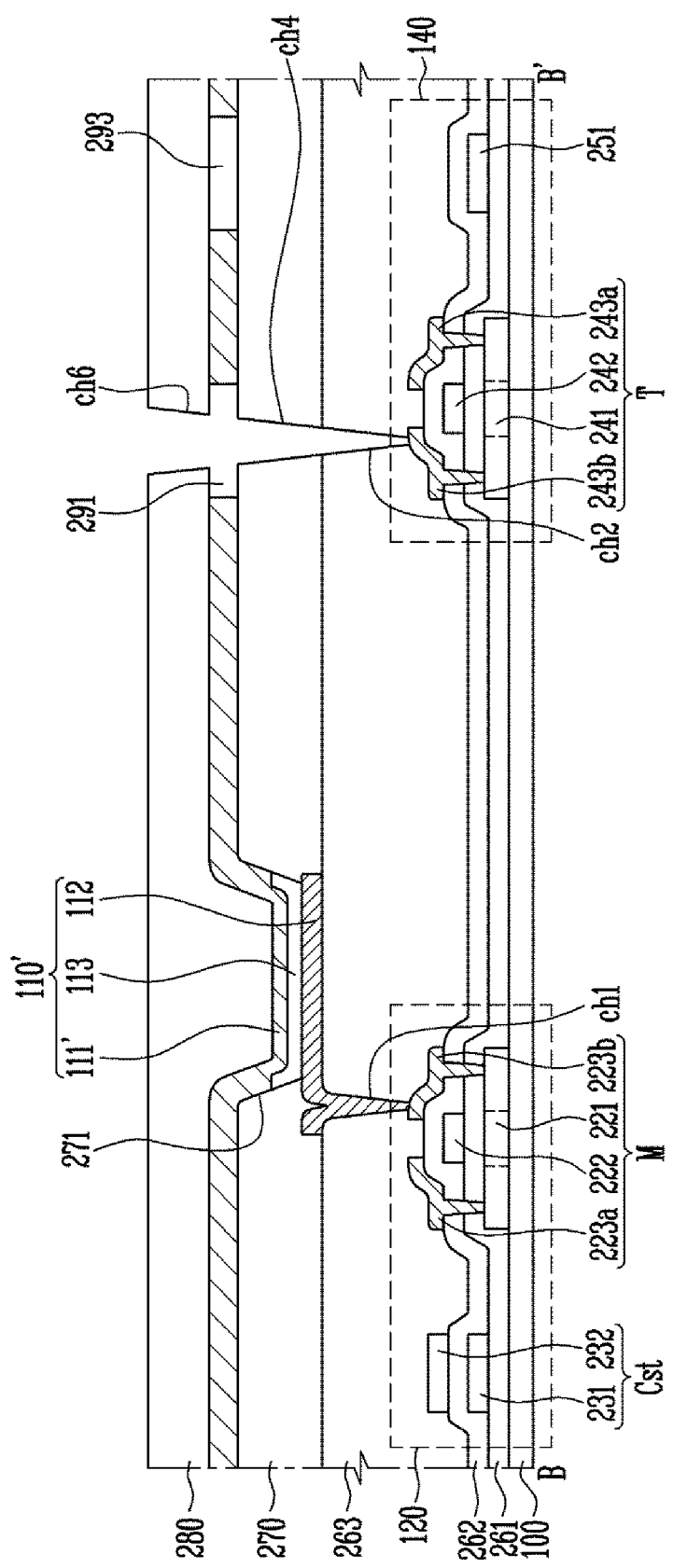

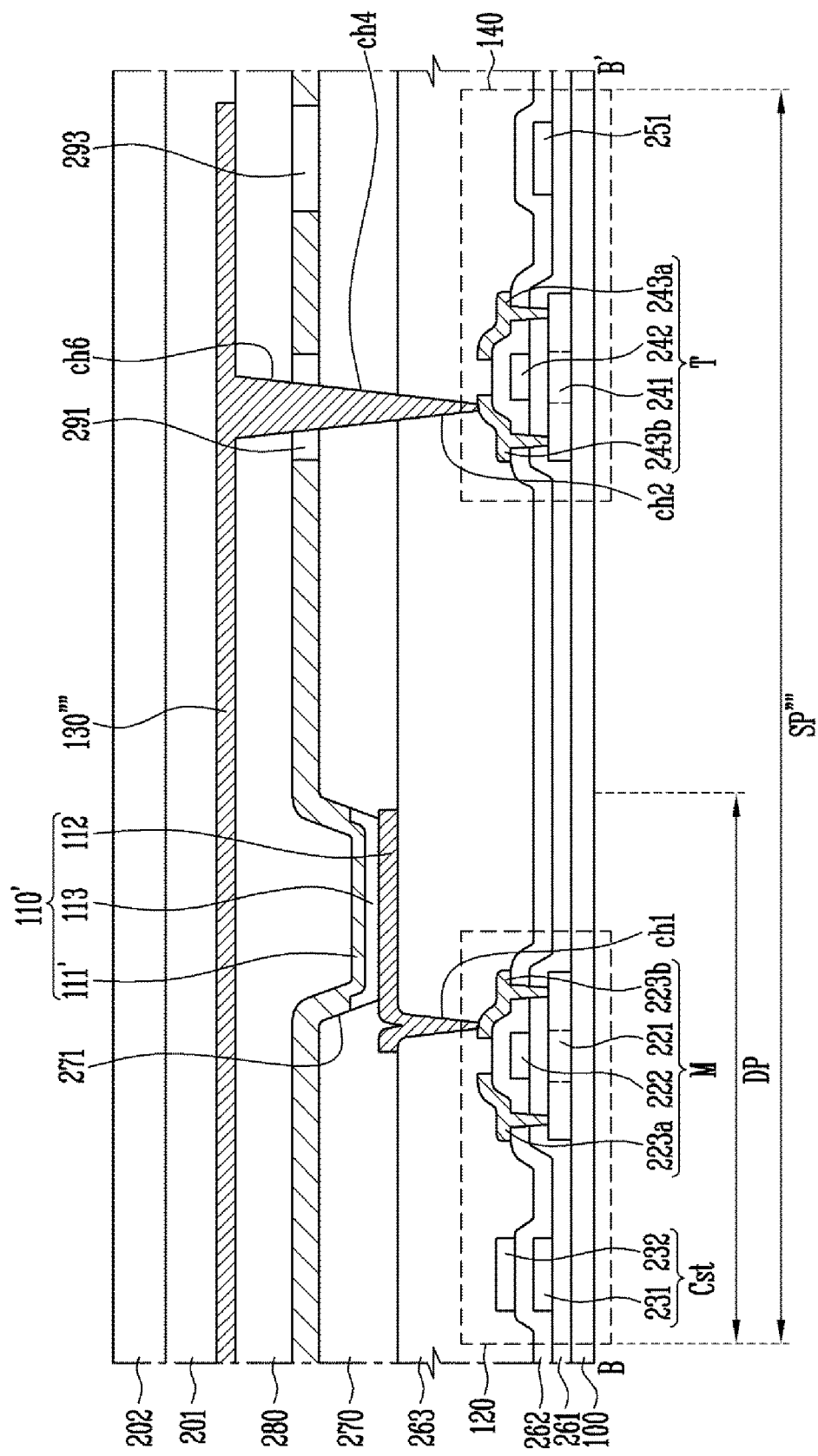

FINGERPRINT SENSOR, DISPLAY DEVICE, AND METHOD OF MANUFACTURING DISPLAY DEVICE

CROSS-REFERENCE TO RELATED APPLICATION

This application claims priority from and the benefit of Korean Patent Application No. 10-2016-0147500, filed Nov. 7, 2016, which is hereby incorporated by reference for all purposes as if fully set forth herein.

BACKGROUND

Field

One or more exemplary embodiments relate to a fingerprint sensor, a display device, and a method of manufacturing a display device.

Discussion

As interest in information display rises and a demand for use of portable information media increases, research into and commercialization of display devices have been conducted. Beyond presentation of content, display devices may also provide various additional functions that utilize personal information for financial and/or security functions, as well as provide communication-related functions, such as telephony services, text messaging services, and the like. Accordingly, fingerprint (or epidermal ridge) sensors for restricting access to unauthorized persons are also of interest in association with display devices.

As types for implementing a fingerprint sensor, various recognition types may be utilized, such as an optical type, a thermal type, and a capacitive type. Among these types of fingerprint sensors, a capacitive fingerprint sensor may acquire the shape of a fingerprint (a fingerprint pattern or other information relating to epidermal ridges) by detecting a change in capacitance depending on the shapes of valleys and/or ridges of a fingerprint when a human finger approaches a conductive sensing electrode. A difficultly, however, arises given that conventional fingerprint recognition sensors are provided as hardware structures separate from a conventional display device. In this manner, a conventional fingerprint sensor may occupy its own separate space, and, thereby, occupy valuable real estate and/or an area of a display device that is growing ever smaller as manufacturers seek to reduce or eliminate, for instance, non-display (e.g., bezel) areas of a display device. As such, separate costs and efforts are devoted to individually develop and manufacture a fingerprint recognition sensor and a display device.

The above information disclosed in this section is only for enhancement of an understanding of the background of the inventive concepts, and, therefore, it may contain information that does not form prior art already known to a person of ordinary skill in the art.

SUMMARY

One or more exemplary embodiments provide a fingerprint sensor that enables the recognition of a fingerprint, a display device, and a method of manufacturing the display device.

One or more exemplary embodiments provide a display device and a method of manufacturing the display device that may reduce the number of manufacturing processes and manufacturing costs, and, thereby, increase manufacturing efficiencies.

Additional aspects will be set forth in the detailed description which follows, and, in part, will be apparent from the disclosure, or may be learned by practice of the inventive concepts.

According to one or more exemplary embodiments, a display device includes a display pixel and a sensor pixel. The display pixel includes a light-emitting element including a first pixel electrode. The display pixel further includes a pixel circuit electrically coupled to the light-emitting element. The sensor pixel includes a sensor electrode overlapping the first pixel electrode. The sensor pixel further includes a sensor circuit electrically coupled to the sensor electrode. The first pixel electrode includes a first opening in a region overlapping the sensor electrode.

According to one or more exemplary embodiments, a fingerprint sensor includes sensor scan lines, output lines, and sensor pixels coupled to the sensor scan lines and the output lines. Among the sensor pixels, a sensor pixel coupled to an i-th ("i" being an integer of two or more) sensor scan line and an i−1-th sensor scan line, and a j-th ("j" being a natural number) output line includes a first transistor, a second transistor, a third transistor, a first capacitor, and a second capacitor. The first transistor is coupled between the j-th output line and a first node. The first transistor includes a gate electrode coupled to a second node. The second transistor is coupled between a reference voltage line and the first node. The second transistor includes a gate electrode coupled to the i-th sensor scan line. The third transistor is coupled between the second node and the reference voltage line. The third transistor includes a gate electrode coupled to the i−1-th sensor scan line. The first capacitor is coupled between the second node and the i-th sensor scan line. The second capacitor coupled to the second node.

According to one or more exemplary embodiments, a method of manufacturing a display device including a sensor electrode includes: forming a pixel circuit on a substrate; forming a sensor electrode on the substrate; forming a light-emitting element on the substrate, the light-emitting element including a first pixel electrode, a light-emitting layer, and a second pixel electrode; forming, via a laser, a first opening in a portion of the first pixel electrode, the first opening overlapping the sensor electrode. The light-emitting element is coupled to the pixel circuit.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIGS. 2A and 2B are views illustrating partial cross-sections of the display device of FIG. 1 taken along sectional line A-A', according to various exemplary embodiments.

FIGS. 4A and 4B are views illustrating partial cross-sections of the display device of FIG. 3 taken along sectional line B-B', according to various exemplary embodiments.

FIGS. 6A and 6B are views illustrating partial cross-sections of a display device, according to various exemplary embodiments.

FIGS. 15A, 15B, 15C, 15D, and 15E are diagrams of a display device at various stages of manufacture, according to one or more exemplary embodiments.

FIGS. 16A, 16B, 16C, 16D, 16E, and 16F are diagrams of a display device at various stages of manufacture, according to one or more exemplary embodiments.

FIGS. 17A, 17B, 17C, 17D, 17E, 17F, and 17G are diagrams of a display device at various stages of manufacture, according to one or more exemplary embodiments.

DETAILED DESCRIPTION OF THE ILLUSTRATED EMBODIMENTS

Figure 1:
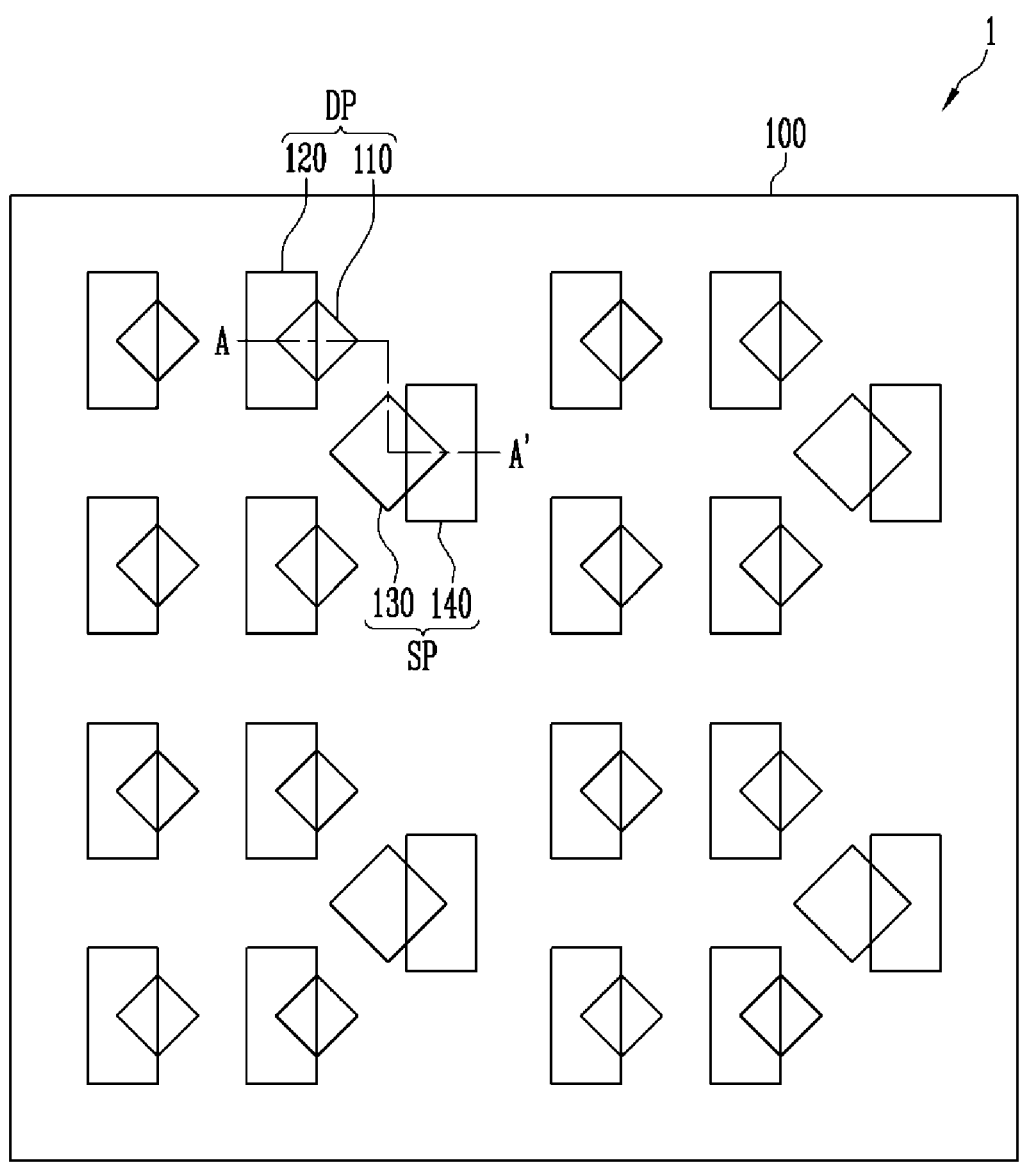
FIG. 1 is a diagram illustrating a display device, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. To this end, various exemplary embodiments may be different, but do not have to be exclusive. For example, specific shapes, configurations, and characteristics of an exemplary embodiment may be implemented in another exemplary embodiment without departing from the spirit and the scope of the present disclosure.

Unless otherwise specified, the illustrated exemplary embodiments are to be understood as providing exemplary features of varying detail of various exemplary embodiments. Therefore, unless otherwise specified, the features, components, modules, layers, films, panels, regions, aspects, etc. (hereinafter collectively referred to as "elements"), of the various illustrations may be otherwise combined, separated, interchanged, and/or rearranged without departing from the disclosed exemplary embodiments.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying figures, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a diagram illustrating a display device, according to one or more exemplary embodiments.

Referring to FIG. 1, a display device 1 may include a substrate 100, display pixels DP, and sensor pixels SP.

The substrate 100 may be made of any suitable material, e.g., an insulating material, such as glass or resin. Further, the substrate 100 may be made of a material having flexibility to enable substrate 100 to be intentionally bendable, foldable, etc., and may have a single-layer structure or a multi-layer structure. For example, the substrate 100 may be made of a material including at least one selected from the group consisting of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material used to form the substrate 100 may be variously changed, and may also be implemented using, for example, fiberglass-reinforced plastic (FRP), carbon nanotubes, and/or the like.

The display pixels DP may be disposed on the substrate 100 and may be configured to provide a determined image to a user by emitting light having one or more specific colors. For this operation, each of the display pixels DP may include a light-emitting element 110 and a pixel circuit 120. The light-emitting element 110 may emit light of a determined intensity under the control of the pixel circuit 120. For example, the light-emitting element 110 may be an organic light-emitting diode (OLED), which is a self-luminous light-emitting element.

The pixel circuit 120 may be electrically coupled to the light-emitting element 110 to be capable of controlling the light-emitting element 110. The pixel circuit 120 may control the intensity of light emitted from the light-emitting element 110 by adjusting a drive current supplied to the light-emitting element 110.

The sensor pixels SP may be disposed on the substrate 100 and may function to detect the a touch interaction and fingerprint (or other epidermal ridge information) of a user. A recognition operation that may be implemented by the sensor pixels SP may include at least one of the identification of a location where a touch interaction is made, the recognition of a fingerprint of a touching finger associated with the touch interaction, and the sensing of a touch pressure of the touch interaction. For example, the sensor pixels SP may function as a capacitive touch sensor, a fingerprint sensor, and a pressure sensor. In this manner, each of the sensor pixels SP may include a sensor electrode 130 and a sensor circuit 140.

The sensor electrode 130 may form a capacitor with a finger (or other appendage) of a user, and capacitance of the capacitor may change depending on a distance between the sensor electrode 130 and the finger, the presence or absence of a valley or ridge of the fingerprint on the sensor electrode 130, or the intensity of pressure of a touch. The sensor circuit 140 may be electrically coupled to the sensor electrode 130 and may output a sensing current corresponding to a change in capacitance between the sensor electrode 130 and the finger.

Although FIG. 1 illustrates a unit sensor pixel SP arranged with every four display pixels DP, exemplary embodiments are not limited thereto or thereby. As such, the resolution of the sensor pixels SP may be variously changed.

Figure 2A:
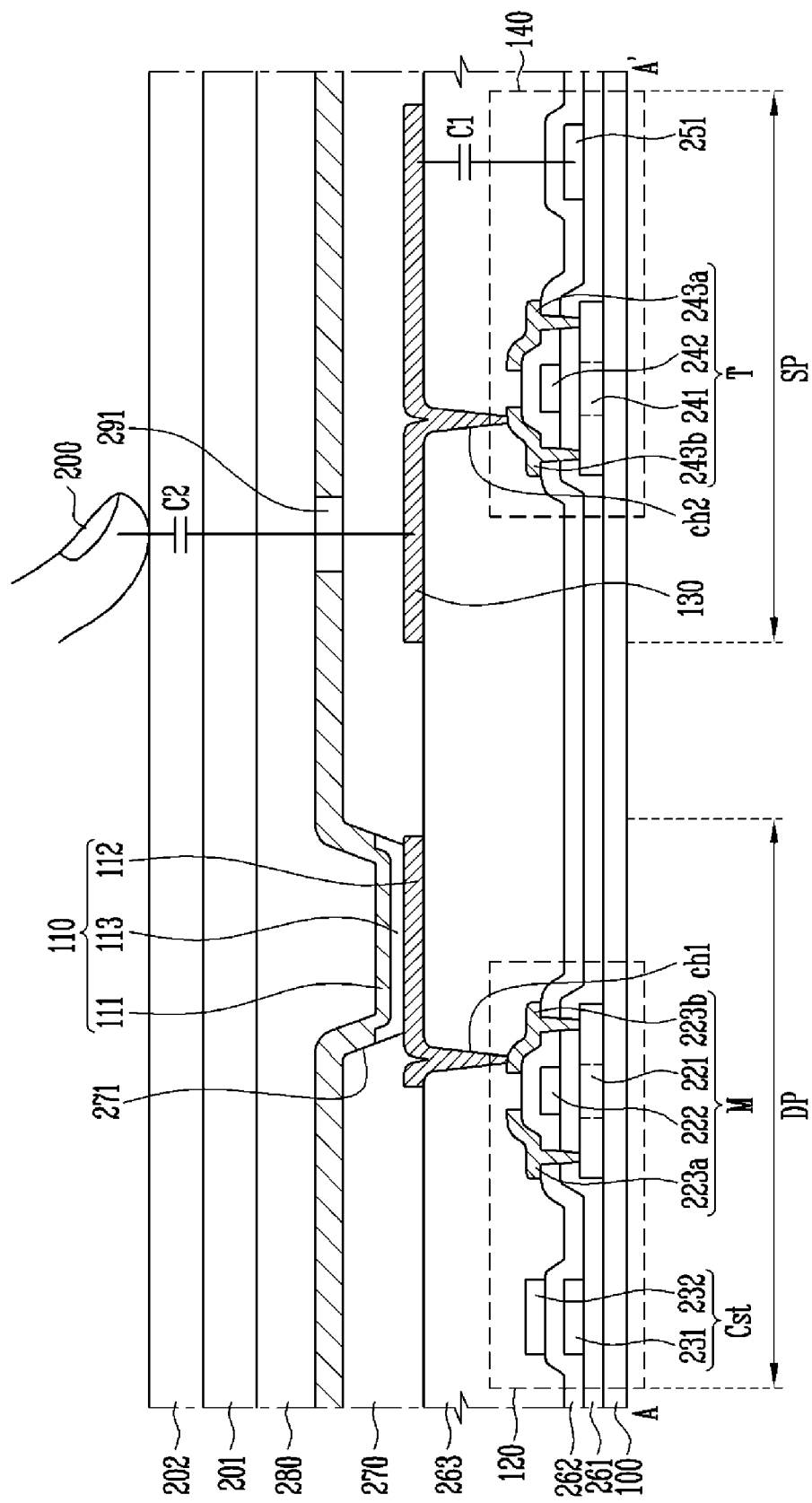

FIGS. 2A and 2B are views illustrating partial cross-sections of the display device of FIG. 1 taken along sectional line A-A', according to various exemplary embodiments.

Referring to FIG. 2A, a display pixel DP may be disposed on the substrate 100. Further, the display pixel DP may include a pixel circuit 120 disposed on the substrate 100 and a light-emitting element 110 disposed over (or otherwise associated with) the pixel circuit 120. It is noted that although only some components (e.g., a transistor M and a capacitor Cst), among components included in the pixel circuit 120, are illustrated in FIG. 2A for descriptive and illustrative convenience, the pixel circuit 120 may additionally include other transistors and capacitors that may function to control light emission of the light-emitting element 110.

The transistor M of the pixel circuit 120 may be formed on the substrate 100 and may include a semiconductor layer 221, a gate electrode 222, a source electrode 223a, and a drain electrode 223b.

The semiconductor layer 221 may be formed with a determined pattern on the substrate 100. The semiconductor layer 221 may be made of any suitable material, such as polysilicon formed by crystalizing amorphous silicon, deposited on the substrate 100 in a single layer or multi-layer structure. As another example, the semiconductor layer 221 may be made of amorphous silicon or an oxide semiconductor in addition to polysilicon. Again, however, any other suitable material may be utilized in association with exemplary embodiments.

A buffer layer (not illustrated) may be disposed (e.g., interposed) between the substrate 100 and the semiconductor layer 221. The buffer layer may be configured to prevent (or at least reduce) the diffusion of impurities contained in the substrate 100, and may be made of an insulating material, such as silicon oxide ($SiO_x$), silicon nitride ($SiN_x$), silicon oxynitride ($Si_xN_yO_z$), and/or the like. Also, the buffer layer may be formed to have a single-layer or multi-layer structure.

A first gate insulating layer 261 may be formed on the semiconductor layer 221. The first gate insulating layer 261 may be made of an insulating material, such as silicon oxide, silicon nitride, silicon oxynitride, etc. The gate electrode 222 may be formed with a determined pattern on the first gate insulating layer 261. An first interlayer insulating layer 262 may be formed on the gate electrode 222. The first interlayer insulating layer 262 may be made of a determined insulating material, such as one or more of the insulating materials described in association with the first gate insulating layer 261. The first gate insulating layer 261 may insulate the semiconductor layer 221 from the gate electrode 222, and the first interlayer insulating layer 262 may insulate the gate electrode 222 from the source electrode 223a and the drain electrode 223b.

The source electrode 223a and the drain electrode 223b may be formed on the first interlayer insulating layer 262. The source electrode 223a and the drain electrode 223b may be electrically coupled to respective ends of the semiconductor layer 221 via contact holes formed in the first gate insulating layer 261 and the first interlayer insulating layer 262.

The gate electrode 222, the source electrode 223a, and the drain electrode 223b may be made of, but are limited to, a metal material, such as molybdenum (Mo), tungsten (W), titanium (Ti), or aluminum (Al), or an alloy structure, or a stacked structure of at least two of these metal materials. It is noted, however, that any suitable conductive material may be utilized in association with exemplary embodiments.

Further, the structure of the transistor M is not limited to the structure illustrated in FIG. 2A, and, as such, may be modified into another structure. For example, although the transistor M having a top gate structure is illustrated in FIG. 2A, the structure of the transistor M may be modified into a bottom gate structure, a dual gate structure, etc.

A planarization layer 263, which is an insulating layer for performing a planarization function, may be formed on the first interlayer insulating layer 262. The planarization layer may cover exposed portions of the source electrode 223a and the drain electrode 223b. For example, the planarization layer 263 may be made of an insulating material, such as silicon oxide, silicon nitride, silicon oxynitride, etc.

A contact hole ch1 is formed in the planarization layer 263 so that a determined portion of the drain electrode 223b is exposed. A second pixel electrode 112 is coupled to the drain electrode 223b through the contact hole ch1 and may be formed on the planarization layer 263. The second pixel electrode 112 may be disposed to overlap the pixel circuit 120, and may form a portion of the light-emitting element 110 with a light-emitting layer 113 and a first pixel electrode 111, which may be a common electrode to one or more pixels.

A pixel definition layer 270 may be disposed on the planarization layer 263. Further, the pixel definition layer 270 may define the locations of respective light-emitting elements 110. For this, the pixel definition layer 270 may expose at least a partial region of the second pixel electrode 112. For example, a plurality of openings 271 for exposing portions of the second pixel electrodes 112 of the light-emitting elements 110 may be present in the pixel definition layer 270, and, as such, a plurality of second pixel electrodes 112 may be arranged such that they are isolated from each other by the pixel definition layer 270. The pixel definition layer 270 may be made of at least one material selected from the group consisting of organic insulating materials, such as an acrylic organic compound, polyamide, and polyimide, but it is not limited thereto or thereby, and may be made of any of various insulating materials.

Each light-emitting element 110 may be formed on the planarization layer 263 and may include the first pixel electrode 111, the second pixel electrode 112, and the light-emitting layer 113. For example, the light-emitting element 110 may be an electroluminescent element (e.g., an organic light-emitting diode), and the first pixel electrode 111 and the second pixel electrode 112 may function as a cathode electrode and an anode electrode, respectively, or vice versa. The light-emitting layer 113 may be formed on the second pixel electrode 112, which is exposed through the opening 271 in the pixel definition layer 270. The first pixel electrode 111 may be formed on the light-emitting layer 113. Accordingly, the light-emitting layer 113 may be interposed between the first pixel electrode 111 and the second pixel electrode 112.

The light-emitting layer 113 may include an organic emission layer for self-luminance. For example, the light-emitting layer 113 may be formed in a structure in which a hole transport layer, an organic emission layer, and an electron transport layer are stacked, and may further include a hole injection layer and an electron injection layer. By means of the aforementioned structure, holes injected from the second pixel electrode 112 and electrons injected from the first pixel electrode 111 are combined with each other on (or in) the organic emission layer to generate excitons, and, as such, light having a determined wavelength may be generated from each light-emitting layer 113 via energy from the generated excitons.

The first pixel electrode 111 and the second pixel electrode 112 may include any suitable conductive material. For example, as the conductive material, a metal material, an alloy of metal materials, a conductive polymer, a transparent conductive material, or the like may be used. Examples of the metal material may include copper, silver, platinum, palladium, nickel, tin, aluminum, cobalt, rhodium, iridium, iron, ruthenium, osmium, manganese, molybdenum, tungsten, niobium, tantalum, titanium, bismuth, antimony, lead, etc. Further, examples of the conductive polymer may include polythiophene, polypyrrole, polyaniline, polyacetylene and polyphenylene compounds, and mixtures thereof. For instance, among the polythiophene compounds, poly-3, 4-ethylenedioxythiophene/polystyrenesulfonate (PEDOT/PSS) compounds may be used. Examples of the transparent conductive material may include silver nanowires (AgNW), indium tin oxide (ITO), indium zinc oxide (IZO), antimony zinc oxide (AZO), indium tin zinc oxide (ITZO), zinc oxide (ZnO), tin oxide (SnO2), a carbon nanotube, graphene, etc. It is also noted that the first pixel electrode 111 and the second pixel electrode 112 may have a single-layer or a multi-layer structure. Further, the layer structure of the first pixel electrode 111 and the second pixel electrode 112 may the same or different.

The capacitor Cst of the pixel circuit 120 may include a first capacitor electrode 231 and a second capacitor electrode 232. The first interlayer insulating layer 262 may be interposed between the first capacitor electrode 231 and the second capacitor electrode 232. The first capacitor electrode 231 may be made of a material identical to that of the gate electrode 222 of the transistor M, and the second capacitor electrode 232 may be made of a material identical to that of the source electrode 223a and the drain electrode 223b of the transistor M. Further, the structure of the capacitor Cst is not limited to the structure illustrated in FIG. 2A, and may be modified into any other suitable structure.

Referring to FIG. 2A, the sensor pixel SP may be disposed on the substrate 100. Further, the sensor pixel SP may include a sensor circuit 140 disposed on the substrate 100 and a sensor electrode 130 disposed over (or otherwise in association with) the sensor circuit 140. It is noted that, although only some components (e.g., a transistor T and a capacitor electrode 251), among components included in the sensor circuit 140, are illustrated in FIG. 2A for descriptive and illustrative convenience, the sensor circuit 140 may further include other transistors and capacitors that may function to detect a user's fingerprint or the like. Further, the sensor circuit 140 may be disposed on (or at) the same layer as the pixel circuit 120. For example, the transistor T of the sensor circuit 140 may be disposed on the same layer as the transistor M of the pixel circuit 120, and may be formed using the same process(es) as the transistor M.

The transistor T of the sensor circuit 140 may include a semiconductor layer 241, a gate electrode 242, the source electrode 243a, and the drain electrode 243b. The transistor T may have the same structure as the transistor M of the pixel circuit 120, or may have a different structure from the transistor M of the pixel circuit 120.

The planarization layer 263 may be formed on the pixel circuit 120 and the sensor circuit 140. The sensor electrode 130 may be made of a material identical to that of the second pixel electrode 112. For example, the sensor electrode 130 may include a conductive material. For example, as the conductive material, a metal material, an alloy of metal materials, a conductive polymer, a transparent conductive material, or the like may be used. Examples of the metal material may include copper, silver, platinum, palladium, nickel, tin, aluminum, cobalt, rhodium, iridium, iron, ruthenium, osmium, manganese, molybdenum, tungsten, niobium, tantalum, titanium, bismuth, antimony, lead, etc. Further, examples of the conductive polymer may include polythiophene, polypyrrole, polyaniline, polyacetylene and polyphenylene compounds, and mixtures thereof. In particular, among the polythiophene compounds, poly-3,4-ethylenedioxythiophene/polystyrenesulfonate (PEDOT/PSS) compounds may be used.

Examples of the transparent conductive material may include silver nanowires (AgNW), indium tin oxide (ITO), indium zinc oxide (IZO), antimony zinc oxide (AZO), indium tin zinc oxide (ITZO), zinc oxide (ZnO), tin oxide (SnO2), a carbon nanotube, graphene, etc. Further, the sensor electrode 130 may have a single-layer or multi-layer structure, which may be identical to the layer structure of the second pixel electrode 112.

The sensor electrode 130 may be disposed on (or at) the same layer as the second pixel electrode 112. Accordingly, the sensor electrode 130 does not overlap the second pixel electrode 112. For example, the sensor electrode 130 may be disposed on the planarization layer 263, may be disposed to overlap the sensor circuit 140, and may be spaced apart from the second pixel electrode 112. Furthermore, the sensor electrode 130 may be disposed beneath the pixel definition layer 270, e.g., between the pixel definition layer 270 and the substrate 100. In this manner, the sensor electrode 130 may be interposed between the pixel definition layer 270 and the planarization layer 263.

A contact hole ch2 is formed in the planarization layer 263 so that a determined portion of the source or drain electrode 243a or 243b is exposed. The sensor electrode 130 may be coupled to the source or drain electrode 243a or 243b through the contact hole ch2. Further, the sensor electrode 130 may form a first capacitor C1 with the capacitor electrode 251 included in the sensor circuit 140. For example, the capacitor electrode 251 may be made of a material identical to that of the gate electrode 242 of the transistor T. Also, the capacitor electrode 251 may be disposed on the first gate insulating layer 261.

The first pixel electrode 111 may be formed on the entire surface to overlap sensor pixels SP as well as display pixels DP. In this manner, the first pixel electrode 111 may be referred to as a common electrode. For example, the first pixel electrode 111 may extend to each sensor pixel SP along the pixel definition layer 270, and, as such, the first pixel electrode 111 may overlap the sensor electrode 130. That is, the first pixel electrode 111 may include a first portion overlapping the light-emitting layer 113, and a second portion overlapping the sensor electrode 130. A constant voltage or a ground voltage may be applied to the first pixel electrode 111, and may block an electric field between the user's finger 200 and the sensor electrode 130. In this manner, the sensor pixel SP may not be normally operated, and, as such, the first pixel electrode 111 may include a first opening 291 formed in a region overlapping the sensor electrode 130 to enable operation of the sensor pixel SP.

Through the first opening 291, an electric field may be formed between the finger 200 of a user and the sensor electrode 130, and the finger 200 and the sensor electrode 130 may form a second capacitor C2. For example, the first opening 291 may be formed through a laser etching process; however, exemplary embodiments are not limited thereto or thereby. As such, the first opening 291 may be formed using other various schemes.

An encapsulation layer 280 may be disposed on the first pixel electrode 111. The encapsulation layer 280 may be formed over the sensor pixels SP and the display pixels DP, and may protect the sensor pixels SP and the display pixels DP. For example, the encapsulation layer 280 may block (or at least reduce) the exposure of the light-emitting elements 110 to moisture, oxygen, etc., and, as such, prevent (or at least reduce) the light-emitting elements 110 from being damaged. Further, the encapsulation layer 280 may be formed in a structure in which a plurality of layers are stacked. For example, the encapsulation layer 280 may include at least one organic layer (not illustrated) and at least one inorganic layer (not illustrated). When the encapsulation layer 280 is formed with a multi-layer structure, one or more organic layers and one or more inorganic layers may be alternately stacked with one another.

A polarization layer 201 and a window 202 may be sequentially disposed on the encapsulation layer 280. This structure, however, is merely illustrative, and components arranged on the encapsulation layer 280 may be changed in various manners.

Referring to FIG. 2B, an additional opening 272 may be formed in the pixel definition layer 270. The additional opening 272 may increase the sensitivity of the sensor pixel SP at least because an electric field between the finger 200 and the sensor electrode 130 may be more smoothly generated, e.g., with less interference or impediments. For example, the additional opening 272 may be formed to overlap the first opening 291 of the first pixel electrode 111 and the sensor electrode 130. In one or more exemplary embodiments, the first opening 291 may be concentrically aligned with the additional opening 272, however, exemplary embodiments are not limited thereto or thereby. It is also contemplated that a width of the first opening 291 may be greater than a corresponding width of the additional opening 272.

According to one or more exemplary embodiments, the sensor pixels SP may be integrated into the display device 1 such that the thickness, the number of manufacturing processes, and manufacturing costs of the display device 1 may be reduced. To this end, the sensor pixels SP may be capable of performing multiple sensor-related functions, and, as such, one or more exemplary embodiments may enable less sensors to be formed, but enable the same amount of (or additional) sensing functions to be provided via the display device 1. In this manner, the display device 1 may be more efficient (e.g., consume less power, natural resources, substrate real estate, etc.) than a conventional display device with independent sensors.

Figure 3:
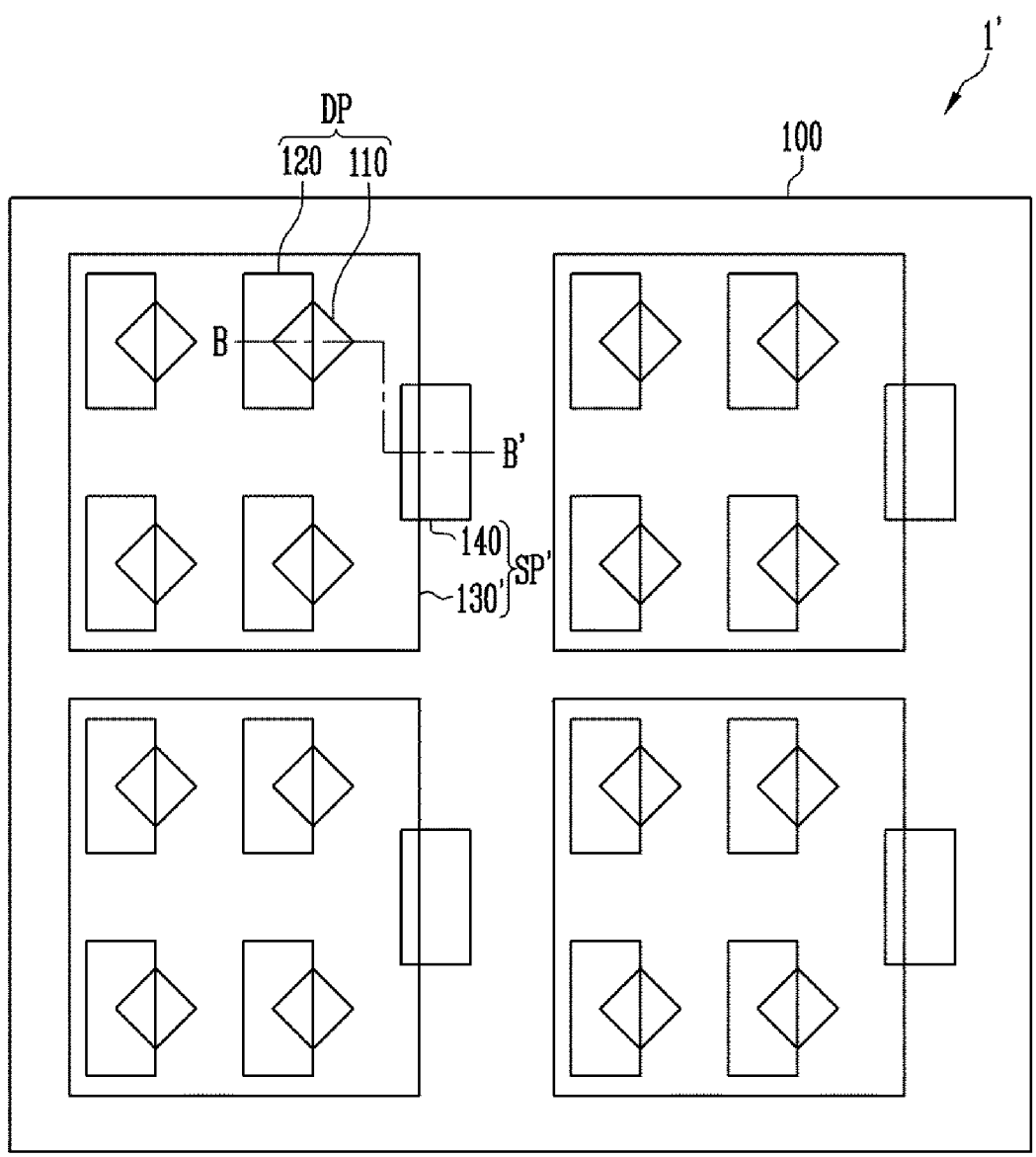
FIG. 3 is a diagram illustrating a display device, according to one or more exemplary embodiments.

FIG. 3 is a diagram illustrating a display device, according to one or more exemplary embodiments. The display device of FIG. 3 may be similar to the display device of FIG. 1. As such, a description of primarily differences from the display device of FIG. 1 will be provided, and a repeated description of components identical to those previously described will be omitted to avoid obscuring exemplary embodiments.

Referring to FIG. 3, a display device 1' may include a substrate 100, display pixels DP, and sensor pixels SP'. Further, each of the display pixels DP may include a light-emitting element 110 and a pixel circuit 120, and each of the sensor pixels SP' may include a sensor electrode 130' and a sensor circuit 140. The sensor electrode 130' may extend to at least one adjacent display pixel DP and may be disposed to overlap the display pixel DP.

Figure 4B:
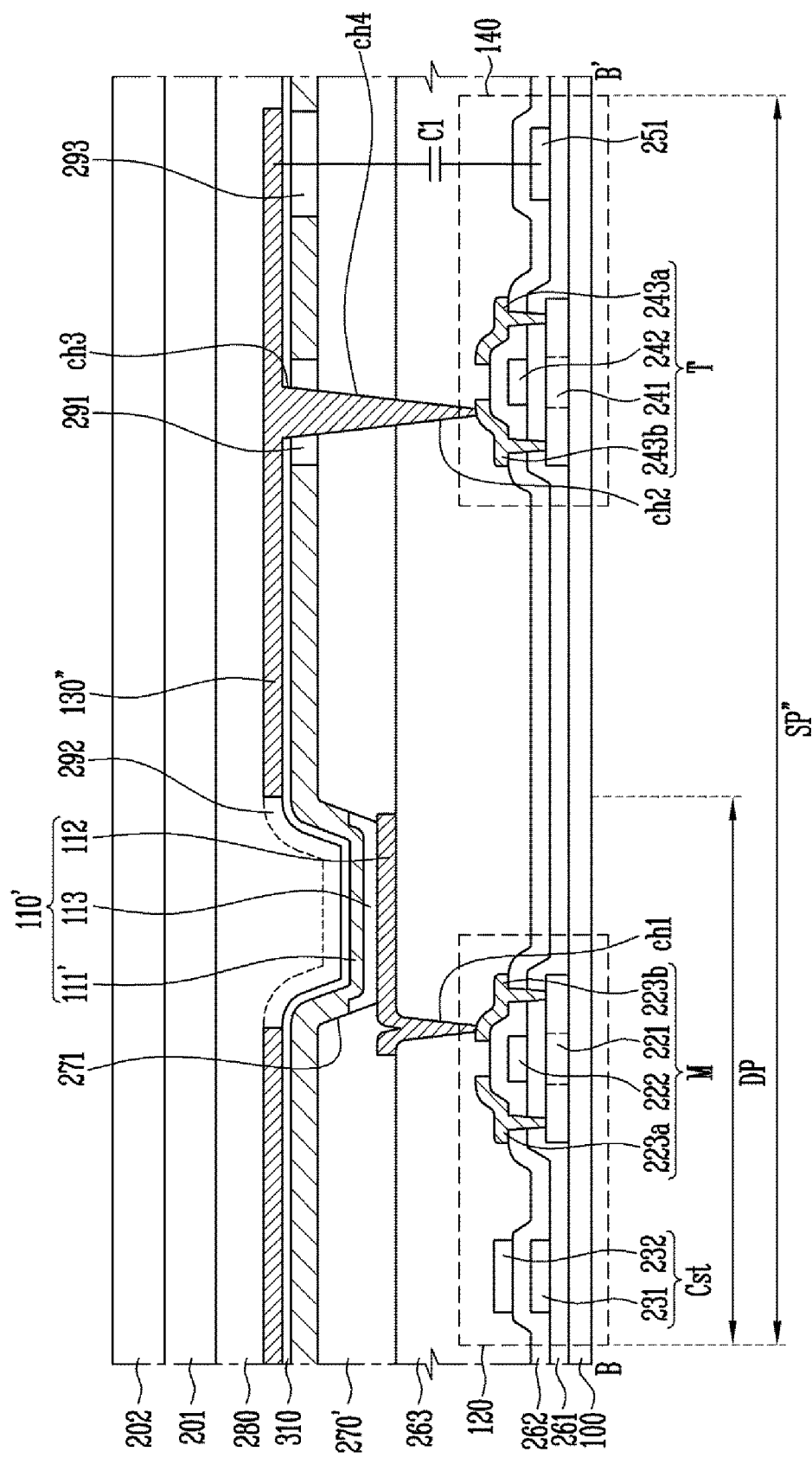

FIGS. 4A and 4B are views illustrating partial cross-sections of the display device of FIG. 3 taken along sectional line B-B', according to various exemplary embodiments. The display devices of FIGS. 4A and 4B may be similar to the display devices of FIGS. 2A and 2B. As such, a description of primarily differences from the display devices of FIGS. 2A and 2B will be provided, and a repeated description of components identical to those previously described will be omitted to avoid obscuring exemplary embodiments.

As seen in FIGS. 4A and 4B, the sensor electrode 130' (or the sensor electrode 130") may be disposed on a layer different from that of the second pixel electrode 112. For example, the sensor electrode 130' (or the sensor electrode 130") may be disposed over a first pixel electrode 111'. To insulate the sensor electrode 130' (or the sensor electrode 130") from the first pixel electrode 111', an insulating layer 310 may be interposed between the sensor electrode 130' (or the sensor electrode 130") and the first pixel electrode 111'.

Openings 291, 293 that overlap the sensor electrode 130' (or the sensor electrode 130") are formed in the first pixel electrode 111'. As such, the sensor electrode 130' (or the sensor electrode 130") may be electrically coupled to the sensor circuit 140 through the first opening 291 in the first pixel electrode 111'. Through a second opening 293, the sensor electrode 130' (or the sensor electrode 130") and the capacitor electrode 251 may form a first capacitor C1. For example, the sensor electrode 130' (or the sensor electrode 130") may be electrically coupled to the sensor circuit 140 through a contact hole ch3 formed in the insulating layer 310, the first opening 291 and a second opening 293 of the first pixel electrode 111', and a contact hole ch4 formed in a pixel definition layer 270'. Furthermore, when a planarization layer 263 is present between the sensor electrode 130' (or the sensor electrode 130") and the sensor circuit 140, the sensor electrode 130' (or the sensor electrode 130") may be electrically coupled to the sensor circuit 140 through a contact hole ch2 formed in the planarization layer 263.

As compared to the configuration illustrated in FIG. 2A, the area of the sensor electrode 130' (or the sensor electrode 130") is increased, and a distance to the finger 200 of a user is further shortened. In this manner, the sensing sensitivity of the sensor pixel SP' (or the sensor pixel SP") may be improved.

When the sensor electrode 130' (or the sensor electrode 130") overlaps the display pixel DP, the sensor electrode 130' (or the sensor electrode 130") may also overlap the light-emitting layer 113 of the display pixel DP. This overlap may slightly deteriorate luminance of the display pixel DP. To prevent (or at least reduce) the deterioration of the luminance, as illustrated in FIG. 4B, the sensor electrode 130" may include an opening 292 formed in a region overlapping the light-emitting layer 113 of the display pixel DP. Accordingly, the deterioration of luminance attributable to the sensor electrode 130" may be prevented or at least reduced.

Figure 5:
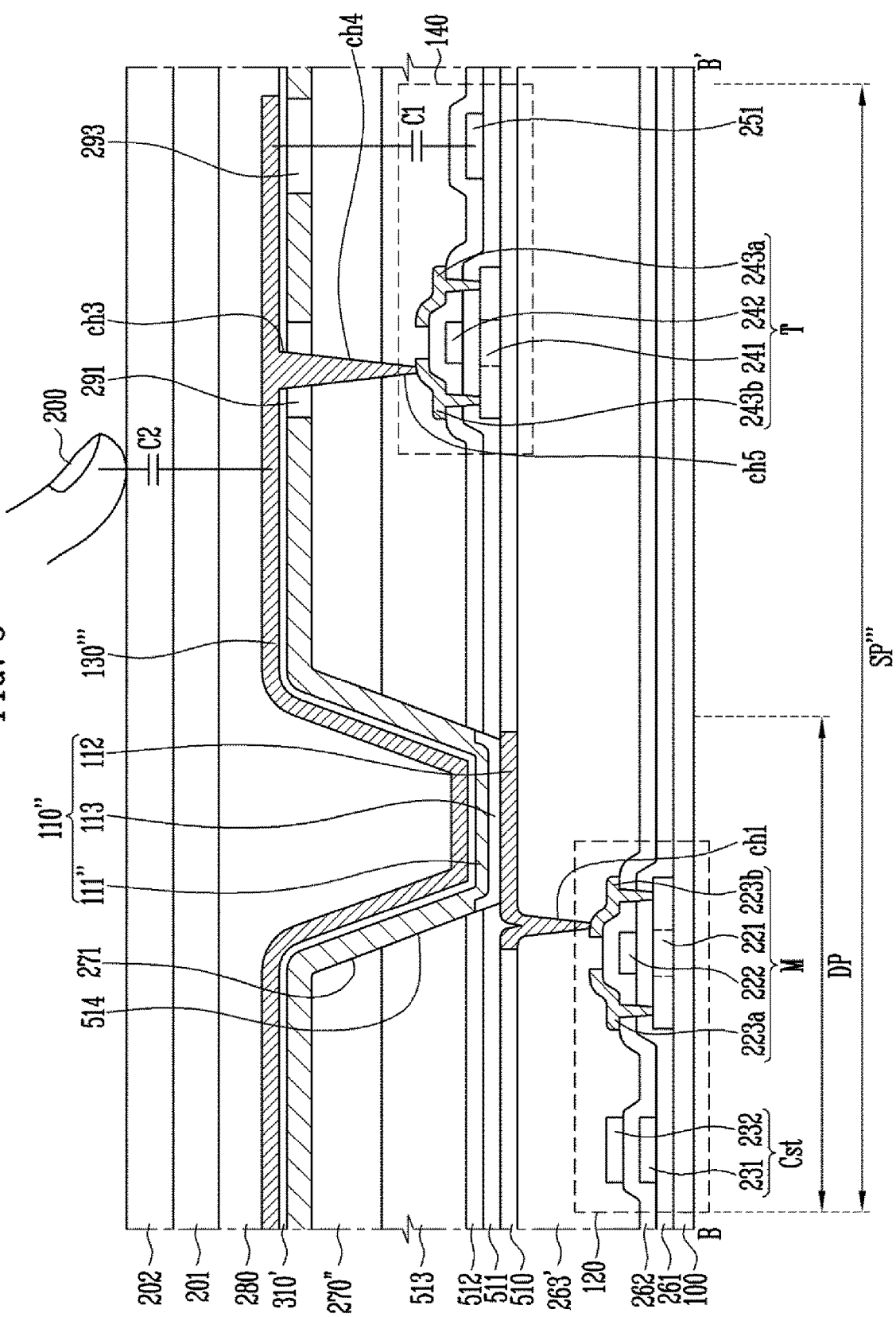
FIG. 5 is a view illustrating a partial cross-section of a display device, according to one or more exemplary embodiments.

FIG. 5 is a view illustrating a partial cross-section of a display device, according to one or more exemplary embodiments. The cross-section illustrated in FIG. 5 is taken along sectional line B-B' of FIG. 3. The display device of FIG. 5 may be similar to the display devices of FIGS. 2A, 2B, 4A, and 4B. As such, a description of primarily differences from the display devices of FIGS. 2A, 2B, 4A, and 4B will be provided, and a repeated description of components identical to those previously described will be omitted to avoid obscuring exemplary embodiments.

Referring to FIG. 5, the pixel circuit 120 of a display pixel DP and the sensor circuit 140 of a sensor pixel SP may be disposed on different layers than one another. For example, the sensor circuit 140 may be disposed on the planarization layer 263' which covers the pixel circuit 120. As such, the transistor T of the sensor circuit 140 may be disposed on the planarization layer 263' or a separate base layer 510.

The transistor T may include a semiconductor layer 241, a gate electrode 242, a source electrode 243a, and a drain electrode 243b. The semiconductor layer 241 may be disposed on the planarization layer 263' or the separate base layer 510. A second gate insulating layer 511 may be formed on the semiconductor layer 241. The second gate insulating layer 511 may be made of an insulating material, such as silicon oxide, silicon nitride, silicon oxynitride, etc.

The gate electrode 242 may be may be formed as a determined pattern on the second gate insulating layer 511. An second interlayer insulating layer 512 may be formed on the gate electrode 242. The second interlayer insulating layer 512 may be made of a determined insulating material, such as one or more of the insulating materials described in association with the second gate insulating layer 511. The second gate insulating layer 511 may insulate the semiconductor layer 241 from the gate electrode 242, and the second interlayer insulating layer 512 may insulate the gate electrode 242 from the source electrode 243a and the drain electrode 243b.

The source electrode 243a and the drain electrode 243b may be formed on the second interlayer insulating layer 512. The source electrode 243a and the drain electrode 243b may be electrically coupled to respective ends of the semiconductor layer 241 via contact holes formed in the second gate insulating layer 511 and the second interlayer insulating layer 512. The gate electrode 242, the source electrode 243a, and the drain electrode 243b may be made of, but are limited to, a metal material, such as molybdenum (Mo), tungsten (W), titanium (Ti), or aluminum (Al), or an alloy structure, or a stacked structure of these metal materials. It is contemplated, however, that any suitable conductive material(s) may be utilized in association with exemplary embodiments.

Further, the structure of the transistor T is not limited to the structure illustrated in FIG. 5, and, as such, may be modified into other structures. For example, although the transistor T having a top gate structure is illustrated in FIG. 5, the structure of the transistor T may be modified into a bottom gate structure, a dual gate structure, etc.

A planarization layer 513, which is an insulating layer for performing a planarization function, may be formed on the second interlayer insulating layer 512, the source electrode 243a, and the drain electrode 243b. For example, the planarization layer 513 may be made of an insulating material, such as silicon oxide, silicon nitride, silicon oxynitride, etc. A contact hole ch5 may be formed in the planarization layer 513 so that a determined portion of the source or drain electrode 243a or 243b is exposed, and a pixel definition layer 270'' may be disposed on the planarization layer 513. The planarization layer 513 may also include an opening 514 overlapping the opening 271 in the pixel definition layer 270''. In this manner, the first pixel electrode 111'', an insulating layer 310', and the sensor electrode 130''' may extend into the opening 514 in the planarization layer 513.

The sensor electrode 130''' disposed on the first pixel electrode 111'' may be electrically coupled to the sensor circuit 140 through a contact hole ch3 formed in the insulating layer 310', the first opening 291 and a second opening 293 of the first pixel electrode 111'', a contact hole ch4 formed in the pixel definition layer 270'', and the contact hole ch5 formed in the planarization layer 513.

A capacitor electrode 251 may form a first capacitor C1 with the sensor electrode 130''' through the second opening 293. For example, the capacitor electrode 251 may be made of a material identical to that of the gate electrode 242 of the transistor T, and may be disposed on a second gate insulating layer 511.

According to one or more exemplary embodiments, since the pixel circuit 120 and the sensor circuit 140 are disposed on different layers, the locations of the pixel circuit 120 and the sensor circuit 140 do not interfere with each other. As such, more various design structures may be implemented. For example, according to one or more exemplary embodiments, the locations of the pixel circuit 120 and the sensor circuit 140 may partially overlap each other in a vertical direction, and, as such, the resolution of the display pixels DP and the sensor pixels SP''' may be further improved.

Figure 6B:
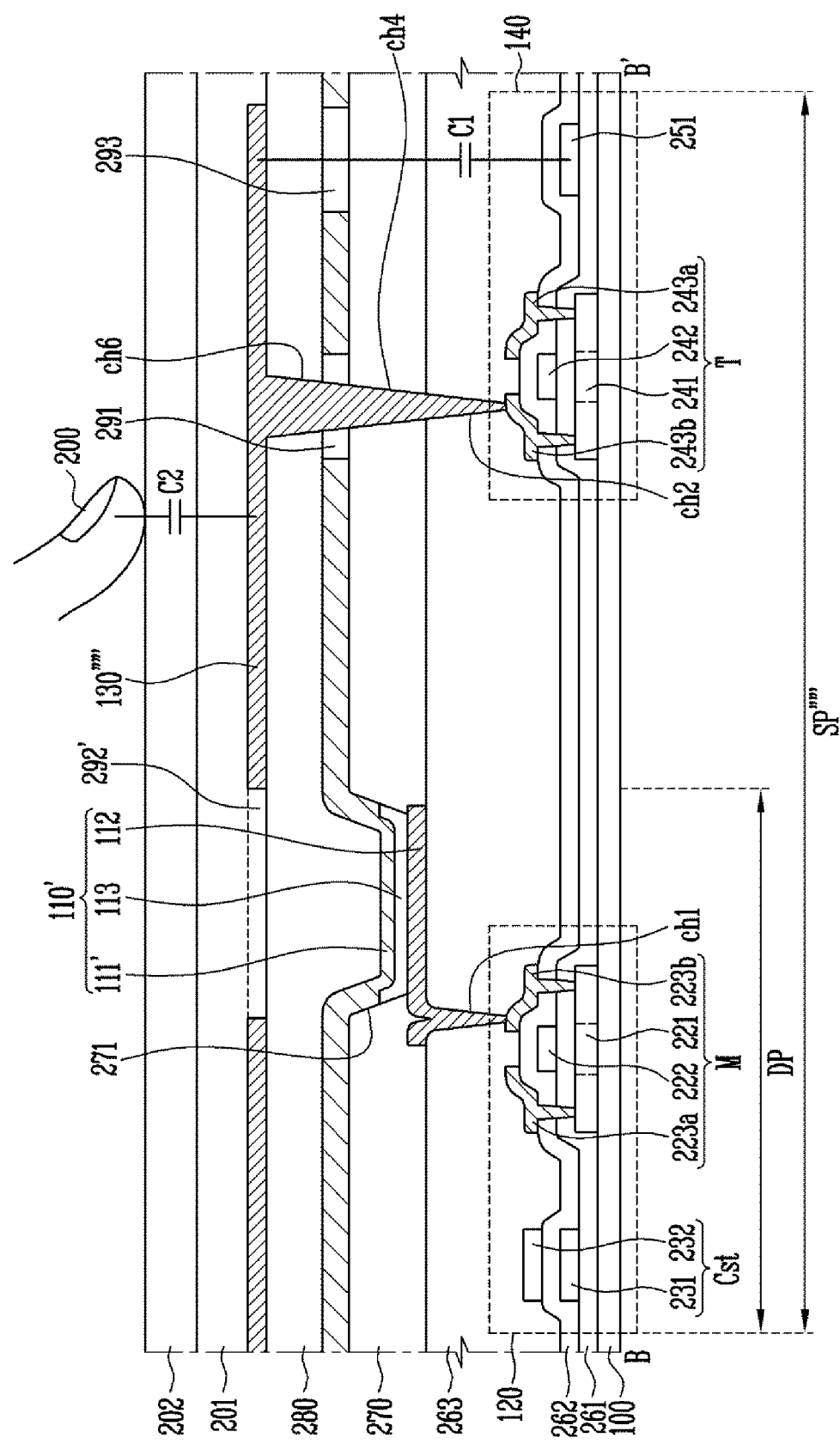

FIGS. 6A and 6B are views illustrating partial cross-sections of a display device, according to various exemplary embodiments. The cross-sections illustrated in FIGS. 6A and 6B are taken along sectional line B-B' of FIG. 3. The display devices of FIGS. 6A and 6B may be similar to the display devices of FIGS. 2A, 2B, 4A, 4B, and 5. As such, a description of primarily differences from the display devices of FIGS. 2A, 2B, 4A, 4B, and 5 will be provided, and a repeated description of components identical to those previously described will be omitted to avoid obscuring exemplary embodiments.

Referring to FIGS. 6A and 6B, a sensor electrode 130'''' (or sensor electrode''''') may be disposed on a layer different from that of a second pixel electrode 112. For example, the sensor electrode 130'''' (or the sensor electrode 130''''') may be disposed on an encapsulation layer 280. Further, since a first opening 291 that overlaps the sensor electrode 130'''' (or the sensor electrode 130''''') is present in a first pixel electrode 111', the sensor electrode 130'''' may be electrically coupled to a sensor circuit 140 disposed below the sensor electrode 130'''' (or the sensor electrode 130''''') through the first opening 291 and a second opening 293 in the first pixel electrode 111'.

For example, the sensor electrode 130'''' (or the sensor electrode 130''''') may be electrically coupled to the sensor circuit 140 through a contact hole ch6 formed in the encapsulation layer 280, the first opening 291 and the second opening 293 in the first pixel electrode 111', and a contact hole ch4 formed in a pixel definition layer 270. Further, when a planarization layer 263 is present between the sensor electrode 130'''' (or the sensor electrode 130''''') and the sensor circuit 140, the sensor electrode 130'''' (or the sensor electrode 130''''') may be electrically coupled to the sensor circuit 140 through a contact hole ch2 formed in the planarization layer 263.

In comparison to the structure in FIG. 2A, the area of the sensor electrode 130'''' (or the sensor electrode 130''''') is increased, and a distance to the finger 200 of a user is further shortened. As such, the sensing sensitivity of each sensor pixel SP'''' (or each sensor pixel SP''''') may be improved.

When the sensor electrode 130'''' overlaps the display pixel DP, the sensor electrode 130'''' may also overlap the light-emitting layer 113 of the display pixel DP, and, as such, luminance may be slightly deteriorated. To overcome (or reduce) this deterioration, as illustrated in FIG. 6B, the sensor electrode 130''''' may include an opening 292' formed in a region which overlaps the light-emitting layer 113 of the display pixel DP. Accordingly, the deterioration of luminance attributable to the sensor electrode 130''''' may be prevented or at least reduced.

Although not illustrated, it is contemplated that the pixel circuit 120 and the sensor circuit 140 of FIGS. 6A and 6B may be disposed on different layers than one another, as illustrated in association with FIG. 5.

Figure 7:
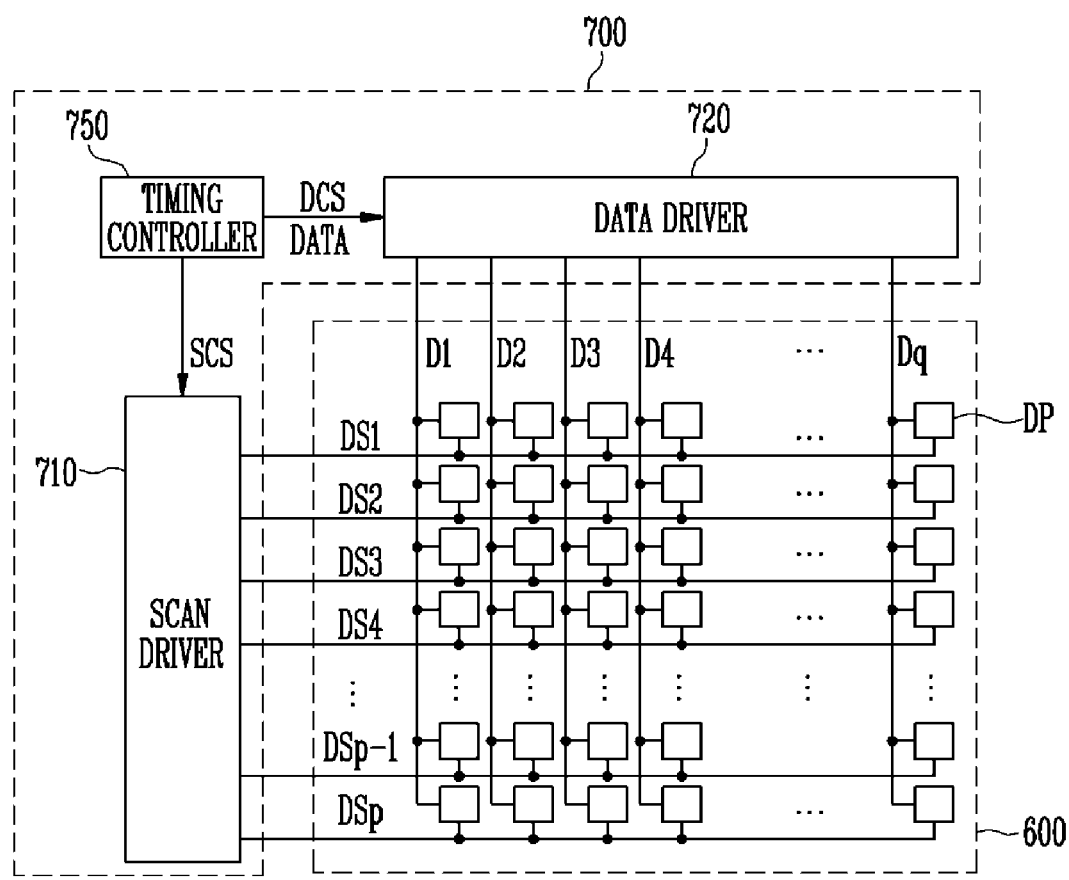
FIG. 7 is a block diagram illustrating pixels and pixel driving components of a display device, according to one or more exemplary embodiments.

FIG. 7 is a block diagram illustrating pixels and pixel driving components of a display device, according to one or more exemplary embodiments.

Referring to FIG. 7, a display pixel unit 600 may include a plurality of display pixels DP. The display pixels DP may be coupled to data lines D1 to Dq and display scan lines DS1 to DSp. For example, the display pixels DP may be arranged in the form of a matrix at intersections of the data lines D1 to Dq and the display scan lines DS1 to DSp. Further, respective display pixels DP may be provided with data signals and display scan signals through the data lines D1 to Dq and the display scan lines DS1 to DSp. Each of the display pixels DP may include a light-emitting element (e.g., an organic light-emitting diode), and may generate light corresponding to a data signal using current flowing from a first power source ELVDD (not shown) into a second power source ELVSS (not shown) via the light-emitting element.

The display device may further include a display driving unit 700 for driving the display pixel unit 600. The display driving unit 700 may include a scan driver 710, a data driver 720, and a timing controller 750.

The scan driver 710 may provide display scan signals to the display scan lines DS1 to DSp in response to a scan driver control signal SCS. For example, the scan driver 710 may sequentially provide the display scan signals to the display scan lines DS1 to DSp. For coupling to the display scan lines DS1 to DSp, the scan driver 710 may be directly mounted on the substrate 100 or may be coupled to the substrate 100 through a separate component, such as a flexible printed circuit board.

The data driver 720 may receive a data driver control signal DCS and image data DATA from the timing controller 750 and may generate data signals based thereon. The data driver 720 may provide the generated data signals to the data lines D1 to Dq. For coupling to the data lines D1 to Dq, the data driver 720 may be directly mounted on the substrate 100 or may be coupled to the substrate 100 through a separate component, such as a flexible printed circuit board.

When a display scan signal is provided through a specific display scan line, some display pixels DP coupled to the display scan line may be provided with the data signals transferred from the data lines D1 to Dq and may emit light at luminance levels corresponding to the provided data signals.

The timing controller 750 may generate control signals for controlling the scan driver 710 and the data driver 720. For example, the control signals may include a scan driver control signal SCS for controlling the scan driver 710 and a data driver control signal DCS for controlling the data driver 720. Further, the timing controller 750 may provide the scan driver control signal SCS to the scan driver 710 and provide the data driver control signal DCS to the data driver 720. The timing controller 750 may convert the image data DATA in conformity with the specification of the data driver 720 and may provide the converted data to the data driver 720.

Although the scan driver 710, the data driver 720, and the timing controller 750 have been individually illustrated in FIG. 7, at least some of these components (or components of the scan driver 710, the data driver 720, and the timing controller 750) may be integrated. It is also contemplated that the scan driver 710, the data driver 720, and the timing controller 750 may be installed using any of various methods, such as chip-on-glass, chip-on-plastic, tape carrier package, and chip-on-film methods.

Figure 8A:
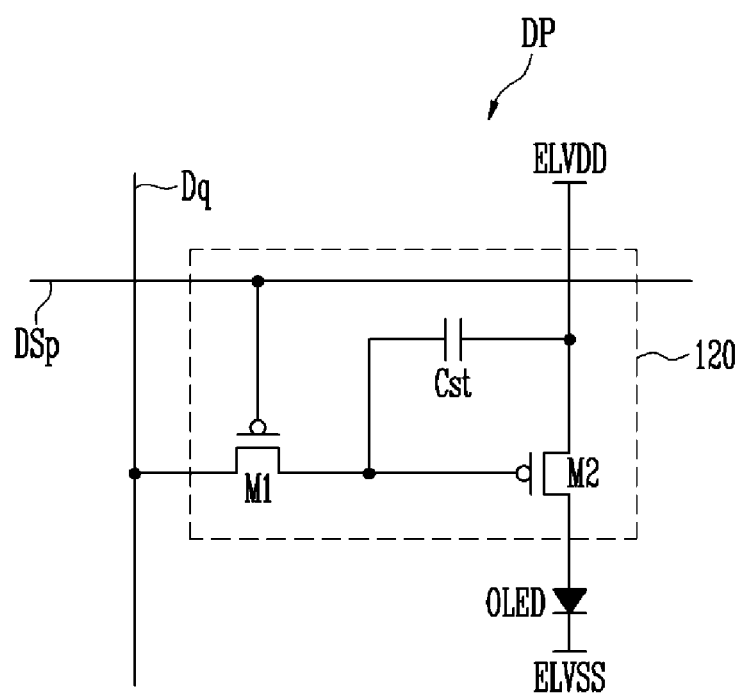
FIGS. 8A and 8B are equivalent circuit diagrams of illustrative unit pixels of the display device of FIG. 7, according to various exemplary embodiments.
Figure 8B:
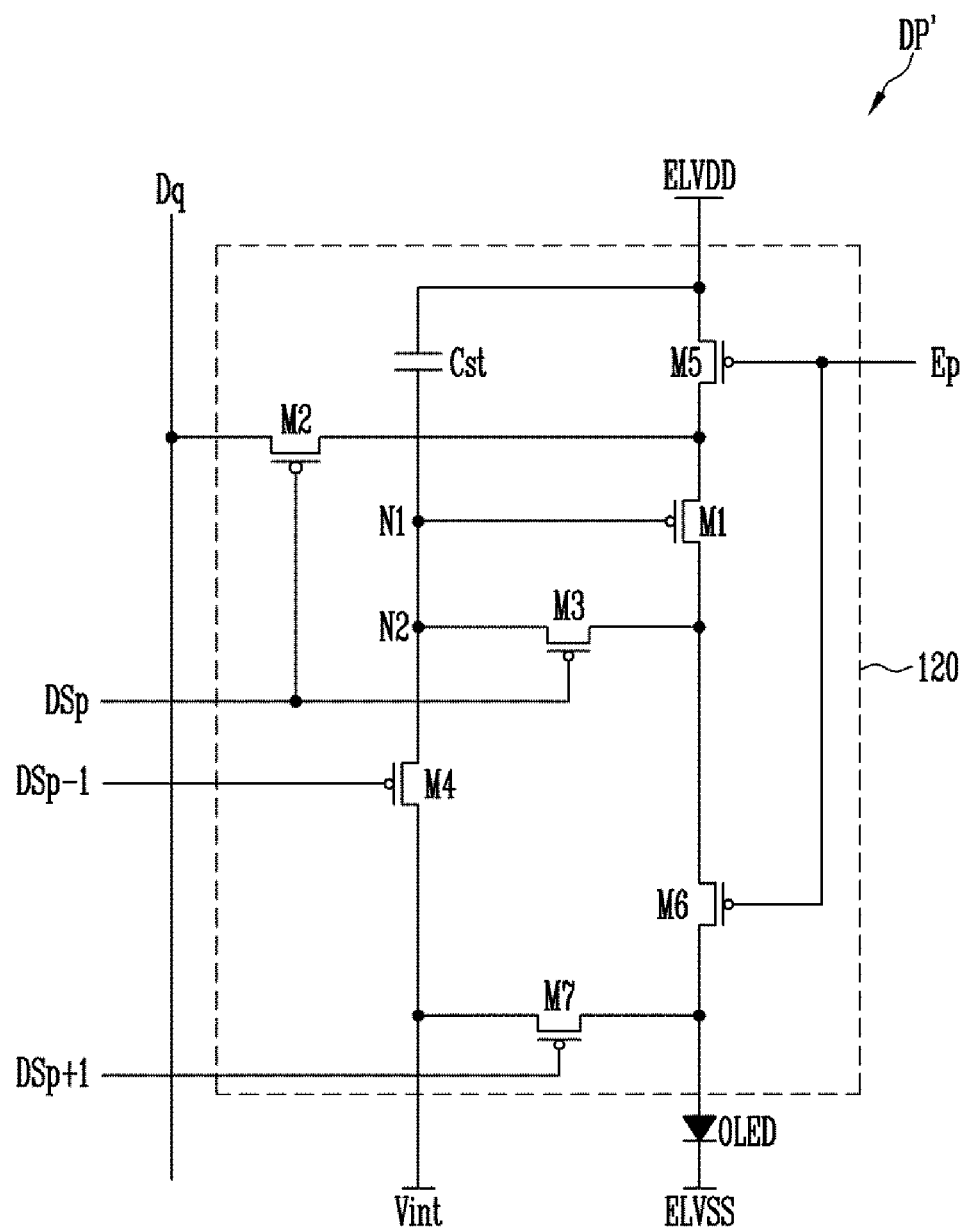

FIGS. 8A and 8B are equivalent circuit diagrams of illustrative unit pixels of the display device of FIG. 7, according to various exemplary embodiments. In FIGS. 8A and 8B, for descriptive convenience, display pixels DP and DP', coupled to a p-th display scan line DSp and a q-th data line Dq, are illustrated. In FIGS. 8A and 8B, a case where the light-emitting element 110 of each of the display pixels DP and DP' is an organic light-emitting diode (OLED) will be illustrated and described in association with one or more exemplary embodiments.

Referring to FIG. 8A, the display pixel DP may include an organic light-emitting diode OLED, and a pixel circuit 120 coupled to the q-th data line Dq and the p-th display scan line DSp. The pixel circuit 120 may be configured to control the organic light-emitting diode OLED. The anode electrode of the organic light-emitting diode OLED may be coupled to the pixel circuit 120 and the cathode electrode of the organic light-emitting diode OLED may be coupled to a second power source ELVSS. Such an organic light-emitting diode OLED may generate light having determined luminance in response to a current supplied from the pixel circuit 120. For instance, when a display scan signal is provided to the p-th display scan line DSp, the pixel circuit 120 may store a data signal that is provided to the q-th data line Dq, and may control the amount of current that is supplied to the organic light-emitting diode OLED in response to the stored data signal.

The pixel circuit 120 may include a first transistor M1, a second transistor M2, and a storage capacitor Cst.

The first transistor M1 may be coupled between the q-th data line Dq and the second transistor M2. For example, the first transistor M1 may be coupled at its gate electrode to the p-th display scan line DSp, at its first electrode to the q-th data line Dq, and at its second electrode to the gate electrode of the second transistor M2. The first transistor M1 may be turned on when the display scan signal is provided from the p-th display scan line DSp, thus providing the data signal from the q-th data line Dq to the storage capacitor Cst. The storage capacitor Cst may charge a voltage corresponding to the data signal.

The second transistor M2 may be coupled between a first power source ELVDD and the organic light-emitting diode OLED. For example, the second transistor M2 may be coupled at its gate electrode to both of the first electrode of the storage capacitor Cst and the second electrode of the first transistor M1, at its first electrode to both of the second electrode of the storage capacitor Cst and the first power source ELVDD, and at its second electrode to the anode electrode of the organic light-emitting diode OLED. The second transistor M2, which is a driving transistor, may control the amount of current that flows from the first power source ELVDD into the second power source ELVSS via the organic light-emitting diode OLED in response to the voltage value stored in the storage capacitor Cst.

The organic light-emitting diode OLED may generate light corresponding to the amount of current supplied from the second transistor M2. The first electrode of each of the first transistor M1 and the second transistor M2 may be set to any one of a source electrode and a drain electrode, and the second electrode of each of the first transistor M1 and the second transistor M2 may be set to an electrode differing from the first electrode. For example, when the first electrode is set to a source electrode, the second electrode may be set to a drain electrode. Further, although the first transistor M1 and the second transistor M2 are exemplarily illustrated as being PMOS transistors in FIG. 8A, the first transistor M1 and the second transistor M2 may be implemented as NMOS transistors in other exemplary embodiments.

Referring to FIG. 8B, the display pixel DP' may include an organic light-emitting diode OLED and a pixel circuit 120 for controlling the organic light-emitting diode OLED. The anode electrode of the organic light-emitting diode OLED may be coupled to the pixel circuit 120 and the cathode electrode of the organic light-emitting diode OLED may be coupled to a second power source ELVSS.

The pixel circuit 120 may include first to seventh transistors M1 to M7 and a storage capacitor Cst. The anode electrode of the organic light-emitting diode OLED may be coupled to the first transistor M1 via the sixth transistor M6, and the cathode electrode of the organic light-emitting diode OLED may be coupled to the second power source ELVSS. The organic light-emitting diode OLED may generate light having determined luminance in response to the amount of current supplied from the first transistor M1. The voltage of the first power source ELVDD may be set to a voltage higher than that of the second power source ELVSS so that current may flow into the organic light-emitting diode OLED.

The seventh transistor M7 may be coupled between an initialization power source Vint and the anode electrode of the organic light-emitting diode OLED. Further, the gate electrode of the seventh transistor M7 may be coupled to a p+1-th display scan line DSp+1. The seventh transistor M7 may be turned on when a display scan signal is provided to the p+1-th display scan line DSp+1, thus supplying the voltage of the initialization power source Vint to the anode electrode of the organic light-emitting diode OLED. The voltage of the initialization power source Vint may be set to a voltage lower than that of a data signal.

The sixth transistor M6 may be coupled between the first transistor M1 and the organic light-emitting diode OLED. Further, the gate electrode of the sixth transistor M6 may be coupled to a p-th light emission control line Ep. The sixth transistor M6 may be turned off in a case where a light emission control signal is provided to the p-th light emission control line Ep, and may be turned on in the remaining cases.

The fifth transistor M5 may be coupled between the first power source ELVDD and the first transistor M1. Further, the gate electrode of the fifth transistor M5 may be coupled to the p-th light emission control line Ep. The fifth transistor M5 may be turned off in a case where a light emission control signal is provided to the p-th light emission control line Ep, and may be turned on in the remaining cases.

The first electrode of the first transistor M1 (e.g., a driving transistor) may be coupled to the first power source ELVDD via the fifth transistor M5, and the second electrode thereof may be coupled to the anode electrode of the organic light-emitting diode OLED via the sixth transistor M6. Also, the gate electrode of the first transistor M1 may be coupled to a first node N1. The first transistor M1 may control the amount of current that flows from the first power source ELVDD to the second power source ELVSS via the organic light-emitting diode OLED in response to the voltage of the first node N1.

The third transistor M3 may be coupled between the second electrode of the first transistor M1 and the first node N1. The gate electrode of the third transistor M3 may be coupled to a p-th display scan line DSp. The third transistor M3 may be turned on when a display scan signal is provided to the p-th display scan line DSp, thus electrically coupling the second electrode of the first transistor M1 to a second node N2. The second node N2 is coupled between the first node N1 and the fourth transistor M4. When the third transistor M3 is turned on, the first transistor M1 may be coupled in the form of a diode.

The fourth transistor M4 may be coupled between the second node N2 and the initialization power source Vint. Further, the gate electrode of the fourth transistor M4 may be coupled to a p−1-th display scan line DSp−1. The fourth transistor M4 may be turned on when a display scan signal is provided to the p−1-th display scan line DSp−1, thus supplying the voltage of the initialization power source Vint to the second node N2.

The second transistor M2 may be coupled between a q-th data line Dq and the first electrode of the first transistor M1. Also, the gate electrode of the second transistor M2 may be coupled to the p-th display scan line DSp. The second transistor M2 may be turned on when a display scan signal is provided to the p-th display scan line DSp, thus electrically coupling the q-th data line Dq to the first electrode of the first transistor M1.

The storage capacitor Cst may be coupled between the first power source ELVDD and the first node N1. The storage capacitor Cst may store a voltage corresponding to the data signal and a voltage corresponding to the threshold voltage of the first transistor M1.

The first electrode of each of the first to seventh transistors M1, M2, M3, M4, M5, M6, and M7 may be set to any one of a source electrode and a drain electrode, and the second electrode of each of the first to seventh transistors M1, M2, M3, M4, M5, M6, and M7 may be set to an electrode differing from the first electrode. For example, when the first electrode is set to a source electrode, the second electrode may be set to a drain electrode. It is also noted that, although the first to seventh transistors M1, M2, M3, M4, M5, M6, and M7 are exemplarily illustrated as being PMOS transistors in FIG. 8B, the first to seventh transistors M1, M2, M3, M4, M5, M6, and M7 may be implemented as NMOS transistors in other embodiments.

The pixel structures of FIGS. 8A and 8B are merely exemplary, and, as such, the display pixels DP and DP' are not limited to these exemplary embodiments. Each of the display pixels DP and DP' has a circuit structure capable of supplying a current to the organic light-emitting diode OLED. As such, the circuit structure of the display pixels DP and DP' may be selected as any one of various structures.

It is also noted that the first power source ELVDD may be a high-potential power source and the second power source ELVSS may be a low-potential power source. For example, the first power source ELVDD may be designated to supply a positive voltage and the second power source ELVSS may be designated to supply a negative voltage or a ground voltage.

Figure 9:
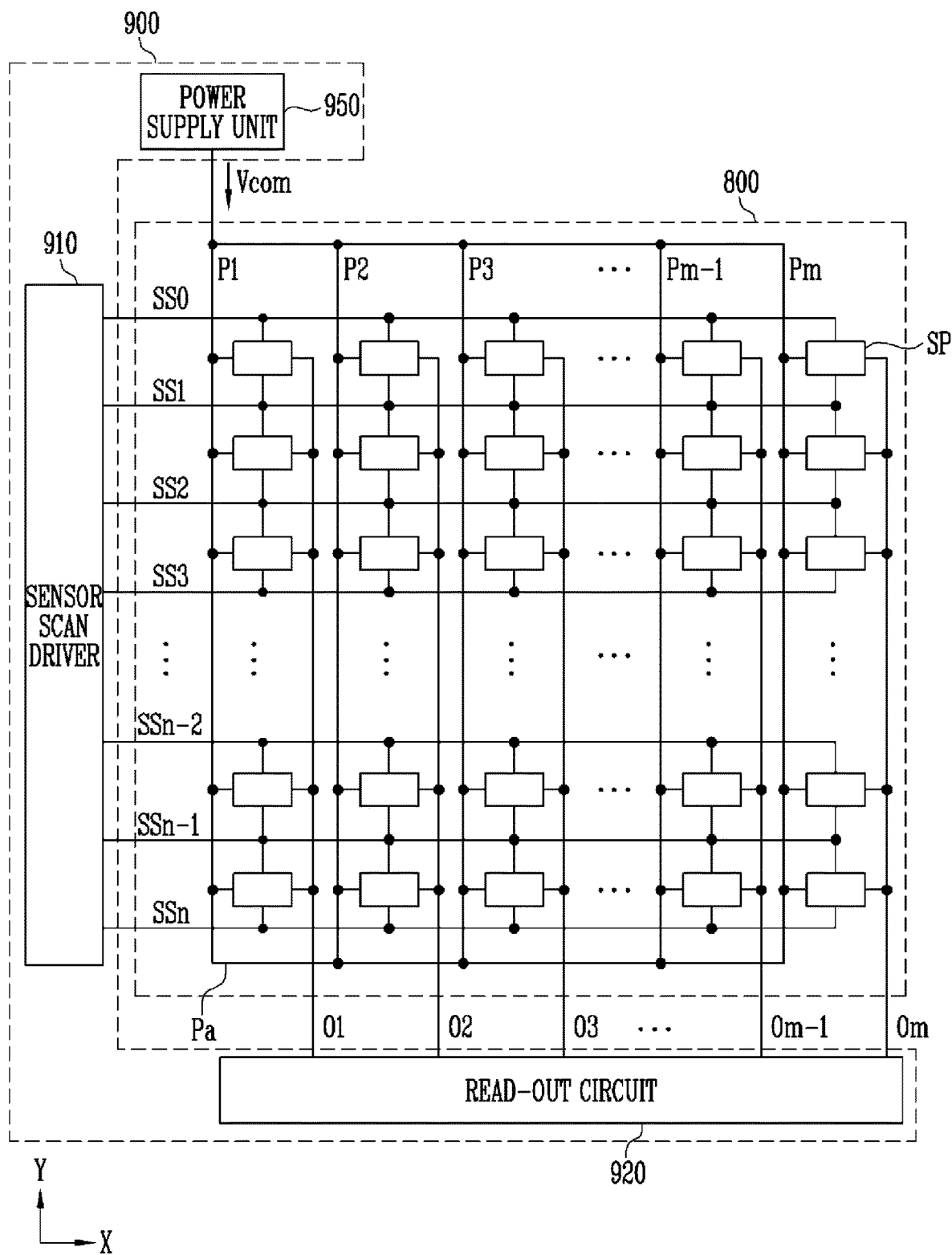
FIG. 9 is a diagram illustrating sensor pixels and sensor driving components, according to one or more exemplary embodiments.

FIG. 9 is a diagram illustrating sensor pixels and sensor driving components, according to one or more exemplary embodiments. A sensor pixel unit 800 and a sensor driving unit 900 may constitute a fingerprint sensor.

Referring to FIG. 9, the sensor pixel unit 800 may include a plurality of sensor pixels SP. The sensor pixels SP may be coupled to sensor scan lines SS0 to SSn and to output lines O1 to Om. The sensor pixels SP may receive sensor scan signals through the sensor scan lines SS0 to SSn and may output a determined current corresponding to a touch state to the output lines O1 to Om during a determined period for the sensor scan signals.

The sensor scan lines SS0 to SSn may be disposed on the substrate 100 and may extend lengthwise along a first direction (e.g., an X axis direction) to be coupled to the sensor pixels SP on a line basis. The output lines O1 to Om may be disposed on the substrate 100, and may extend lengthwise along a second direction (e.g., a Y axis direction) to be coupled to the sensor pixels SP on a line basis.

Further, the sensor pixels SP may be coupled to reference voltage lines P1 to Pm and may be supplied with a reference voltage Vcom through the reference voltage lines P1 to Pm. The reference voltage lines P1 to Pm may extend lengthwise along the second direction (e.g., the Y axis direction) and may be coupled to the sensor pixels SP on a line basis. For example, the reference voltage lines P1 to Pm may be arranged in parallel to the output lines O1 to Om, respectively. However, the arrangement direction of the reference voltage lines P1 to Pm may be changed in various manners, for example, in parallel to the sensor scan lines SS0 to SSn.

The reference voltage lines P1 to Pm may be electrically coupled to each other so as to maintain the same potential. For example, the reference voltage lines P1 to Pm may be electrically coupled to each other via separate wiring Pa in an outer portion of the substrate 100.

According to one or more exemplary embodiments, the sensor driving unit 900 may drive the sensor pixel unit 800. The sensor driving unit 900 may include a sensor scan driver 910, a read-out circuit 920, and a power supply unit 950.

The sensor scan driver 910 may provide sensor scan signals to the sensor pixels SP through the sensor scan lines SS0 to SSn. For example, the sensor scan driver 910 may sequentially output the sensor scan signals to the sensor scan lines SS0 to SSn. The sensor scan signals may have such voltage levels as to turn on transistors, which are provided with the sensor scan signals. For coupling to the sensor scan lines SS0 to SSn, the sensor scan driver 910 may be directly mounted on the substrate 100 or may be coupled to the substrate 100 through a separate component, such as a flexible printed circuit board (FPCB).

The read-out circuit 920 may receive signals (e.g., currents) which are output from the sensor pixels SP through the output lines O1 to Om. For example, when the sensor scan driver 910 sequentially provides sensor scan signals, the sensor pixels SP are selected on a line basis, and the read-out circuit 920 may sequentially receive currents which are output from the sensor pixels SP on a line basis. The read-out circuit 920 may recognize current touch information by sensing a change in current. For example, the touch information may include the location of a touch made on the display device 1, pressure applied by the touch, and at least one of a valley and a ridge included in a fingerprint. For coupling to the output lines O1 to Om, the read-out circuit 920 may be directly mounted on the substrate 100 or may be coupled to the substrate 100 through a separate component, such as a FPCB.

The power supply unit 950 may supply the reference voltage Vcom to the sensor pixels SP through the reference voltage lines P1 to Pm. For coupling to the reference voltage lines P1 to Pm, the power supply unit 950 may be directly mounted on the substrate 100 or may be coupled to the substrate 100 through a separate component, such as a FPCB.

Although the sensor scan driver 910, the read-out circuit 920, and the power supply unit 950 are individually illustrated in FIG. 9, at least some of these components (or components of the sensor scan driver 910, the read-out circuit 920, and the power supply unit 950) may be integrated. Further, the sensor scan driver 910, the read-out circuit 920, and the power supply unit 950 may be installed using any of various methods, such as chip-on-glass, chip-on-plastic, tape carrier package, and chip-on-film methods.

With reference to FIGS. 7 and 9, the scan driver 710, the data driver 720, the timing controller 750, the power supply unit 950, the sensor scan driver 910, the read-out circuit 920, and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, power sources, and/or the like.

According to one or more exemplary embodiments, the features, functions, processes, etc., described herein in association with the scan driver 710, the data driver 720, the timing controller 750, the power supply unit 950, the sensor scan driver 910, the read-out circuit 920, and/or one or more components thereof, may be implemented via software, hardware (e.g., general processor, digital signal processing (DSP) chip, an application specific integrated circuit (ASIC), field programmable gate arrays (FPGAs), etc.), firmware, or a combination thereof. In this manner, the scan driver 710, the data driver 720, the timing controller 750, the power supply unit 950, the sensor scan driver 910, the read-out circuit 920, and/or one or more components thereof may include or otherwise be associated with one or more memories (not shown) including code (e.g., instructions) configured to cause the scan driver 710, the data driver 720, the timing controller 750, the power supply unit 950, the sensor scan driver 910, the read-out circuit 920, and/or one or more components thereof thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CD-RW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

Figure 10:
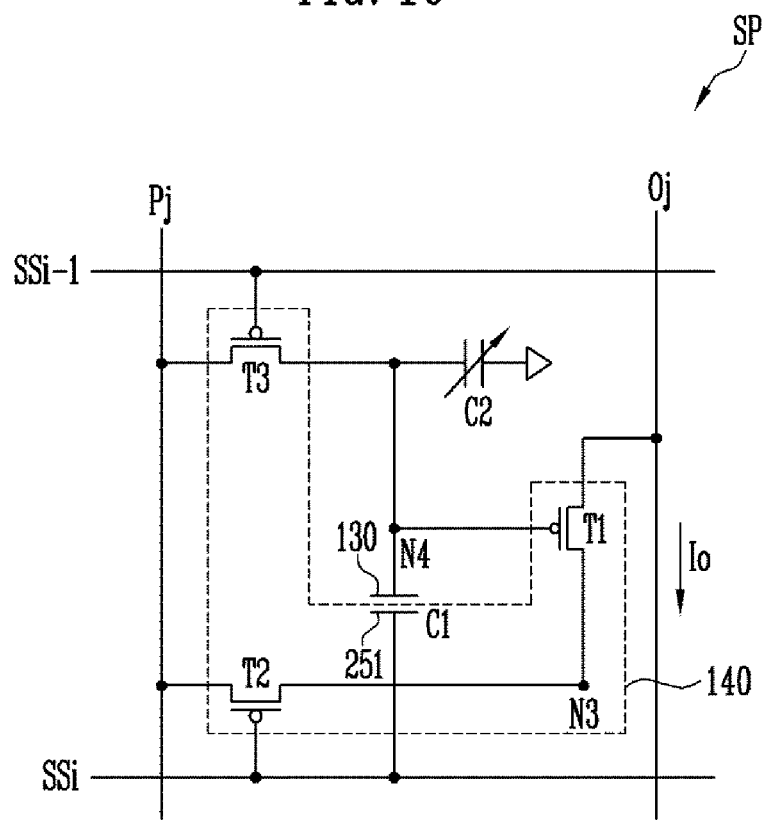
FIG. 10 is an equivalent circuit diagram of an illustrative unit sensor pixel of FIG. 9, according to one or more exemplary embodiments.
Figure 11:
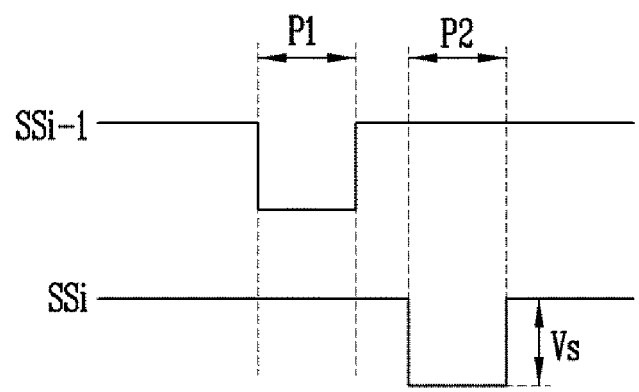
FIG. 11 is a waveform diagram for explaining an operation of the unit sensor pixel of FIG. 10, according to one or more exemplary embodiments.

FIG. 10 is an equivalent circuit diagram of an illustrative unit sensor pixel of FIG. 9, according to one or more exemplary embodiments. FIG. 11 is a waveform diagram for explaining an operation of the unit sensor pixel of FIG. 10, according to one or more exemplary embodiments. For descriptive and illustrative convenience, a sensor pixel SP that is coupled to an i-th sensor scan line SSi, an i−1-th sensor scan line SSi−1, and a j-th output line Oj is illustrated in FIG. 10. Further, in FIG. 11, a sensor scan signal provided to the i−1-th sensor scan line SSi−1 and a sensor scan signal provided to the i-th sensor scan line SSi are illustrated. Also, for illustrative and descriptive convenience, FIGS. 10 and 11 will be described in association with the display device of FIGS. 1 and 2A.

Referring to FIG. 10, the sensor pixel SP may include a sensor electrode 130, a capacitor electrode 251, a first transistor T1, a second transistor T2, and a third transistor T3. As previously described, the sensor electrode 130 and the capacitor electrode 251 may form a first capacitor C1, and the capacitor electrode 251, the first transistor T1, the second transistor T2, and the third transistor T3 may form a sensor circuit 140. Further, the second capacitor C2, which is a variable capacitor, may be implemented using the sensor electrode 130 and the finger 200 of a user, as previously described. The capacitance of the second capacitor C2 may change depending on a distance between the sensor electrode 130 and the finger 200, determination of whether the valley or ridge of a fingerprint is disposed on the sensor electrode 130, the strength of pressure applied by a touch, and/or the like.

The first transistor T1 may control current that flows through the j-th output line Oj. For this current control, the first transistor T1 may be coupled between the j-th output line Oj and the second transistor T2. In other words, the first transistor T1 may be coupled between the j-th output line Oj and a third node N3, and the gate electrode of the first transistor T1 may be coupled to a fourth node N4. For example, the first transistor T1 may include a first electrode coupled to the second electrode of the second transistor T2, a second electrode coupled to the j-th output line Oj, and the gate electrode coupled to the sensor electrode 130.

The second transistor T2 may be coupled between a j-th reference voltage line Pj and the first transistor T1. In other words, the second transistor T2 may be coupled between the j-th reference voltage line Pj and the third node N3, and the gate electrode thereof may be coupled to an i-th sensor scan line SSi. For example, the second transistor T2 may include a first electrode coupled to the j-th reference voltage line Pj, a second electrode coupled to the first electrode of the first transistor T1, and the gate electrode coupled to the i-th sensor scan line SSi. As such, when the sensor scan signal is provided to the i-th sensor scan line SSi, the second transistor T2 may be turned on. When the second transistor T2 is turned on, the reference voltage Vcom may be applied to the first electrode of the first transistor T1.

The third transistor T3 may be coupled between the j-th reference voltage line Pj and the sensor electrode 130. In other words, the third transistor T3 may be coupled between the fourth node N4 and the j-th reference voltage line Pj, and the gate electrode thereof may be coupled to the i−1-th sensor scan line SSi−1. For example, the third transistor T3 may include a first electrode coupled to the j-th reference voltage line Pj, a second electrode coupled to the sensor electrode 130, and the gate electrode coupled to the i−1-th sensor scan line SSi−1. As such, the third transistor T3 may be turned on when a sensor scan signal is provided to the i−1-th sensor scan line SSi−1. When the third transistor T3 is turned on, the voltage of the sensor electrode 130 may be initialized to the reference voltage Vcom.

The capacitor electrode 251 may be disposed to overlap the sensor electrode 130, and may form the first capacitor C1 with the sensor electrode 130. Further, the capacitor electrode 251 may be coupled to the i-th sensor scan line SSi. As such, the first capacitor C1 may be coupled between the fourth node N4 and the i-th sensor scan line SSi. Furthermore, the second capacitor C2 may be coupled to the fourth node N4.

The third node N3 is a node to which the first electrode of the first transistor T1 and the second electrode of the second transistor T2 are coupled in common, and the fourth node N4 is a node to which the sensor electrode 130, the gate electrode of the first transistor T1, and the second electrode of the third transistor T3 are coupled in common. The first electrode of each of the first to third transistors T1, T2, and T3 may be set to any one of a source electrode and a drain electrode, and the second electrode of each of the first to third transistors T1, T2, and T3 may be set to an electrode different from the first electrode. For example, when the first electrode is set to a source electrode, the second electrode may be set to a drain electrode. It is also noted that, although the first to third transistors T1, T2, and T3 are exemplarily illustrated as being PMOS transistors in FIG. 10, the first to third transistors T1, T2, and T3 may be implemented as NMOS transistors in other embodiments.

Referring to FIG. 11, a sensor scan signal may be provided to the i−1-th sensor scan line SSi−1 during a first period P1. Therefore, during the first period P1, the third transistor T3 may remain turned on, and the third node N3 may be initialized to the reference voltage Vcom, which is applied from the j-th reference voltage line Pj. Thereafter, a sensor scan signal may be provided to the i-th sensor scan line SSi during a second period P2. Therefore, during the second period P2, the second transistor T2 may remain turned on, and sensing current Io may flow from the j-th reference voltage line Pj to the j-th output line Oj through the second transistor T2 and the first transistor T1.

The first transistor T1 may control the amount of sensing current Io, which is output in response to a gate voltage (i.e., the voltage of the third node N3). For example, the sensing current Io may change depending on the gate voltage Vg of the first transistor T1, and the gate voltage Vg of the first transistor T1 may be determined by Equation 1:

$$Vg = V\text{com} + \{Vc1/(Vc1+Vc2)\} * Vs \qquad \text{Eq. 1}$$

It is noted that Vcom denotes the reference voltage, Vc1 denotes the capacitance of the first capacitor C1, Vc2 denotes the capacitance of the second capacitor C2, and Vs denotes a change in the voltage of the sensor scan signal provided to the i-th sensor scan line SSi.

The read-out circuit 920 may determine whether a touch has been made and may detect the user's fingerprint, using the sensing current Io. For example, the capacitance of the second capacitor C2 may change depending on a distance between the sensor electrode 130 and the finger 200. Accordingly, the capacitance of the second capacitor C2 in a state in which a touch is made due to the finger 200 differs from the capacitance of the second capacitor C2 in a state in which a touch is not made. Further, the capacitance of the second capacitor C2 in a case where the ridge of the finger 200 is disposed on the sensor electrode 130 differs from the capacitance of the second capacitor C2 in a case where the valley of the finger 200 is disposed on the sensor electrode 130. The change in the capacitance of the second capacitor C2 also influences the output current Io of the sensor pixel SP, so that the read-out circuit 920 may sense the change in the sensing current Io, thus determining whether a touch has been made, and recognizing the user's fingerprint.

When pressure is applied together with the touch made by the finger 200, the distance between the sensor electrode 130 and the finger 200 may gradually decrease, and thus the capacitance of the second capacitor C2 may increase. For example, as externally applied pressure increases, the capacitance of the second capacitor C2 may also increase. However, since a decrement in the distance between the sensor electrode 130 and the finger 200 has a limitation, the capacitance of the second capacitance C2 may not further increase if the external pressure exceeds a determined threshold. The change in the capacitance of the second capacitor C2 also influences the output current Io of the sensor pixel SP, and the read-out circuit 920 may recognize the strength of the touch pressure by sensing the change in the output current Io.

Figure 12:
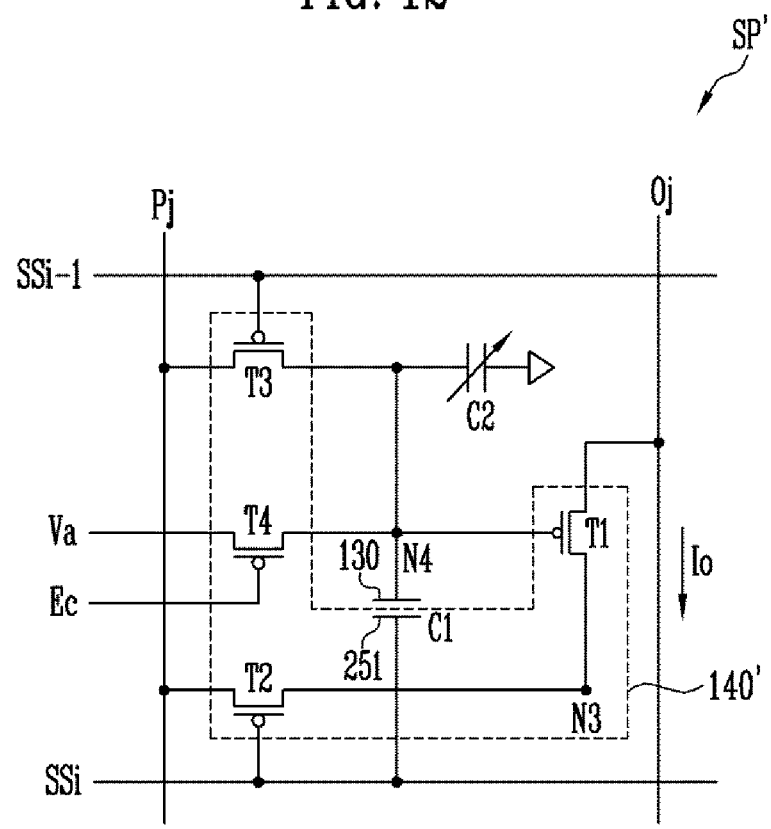
FIG. 12 is an equivalent circuit diagram of an illustrative unit sensor pixel of FIG. 9, according to one or more exemplary embodiments.
Figure 13:
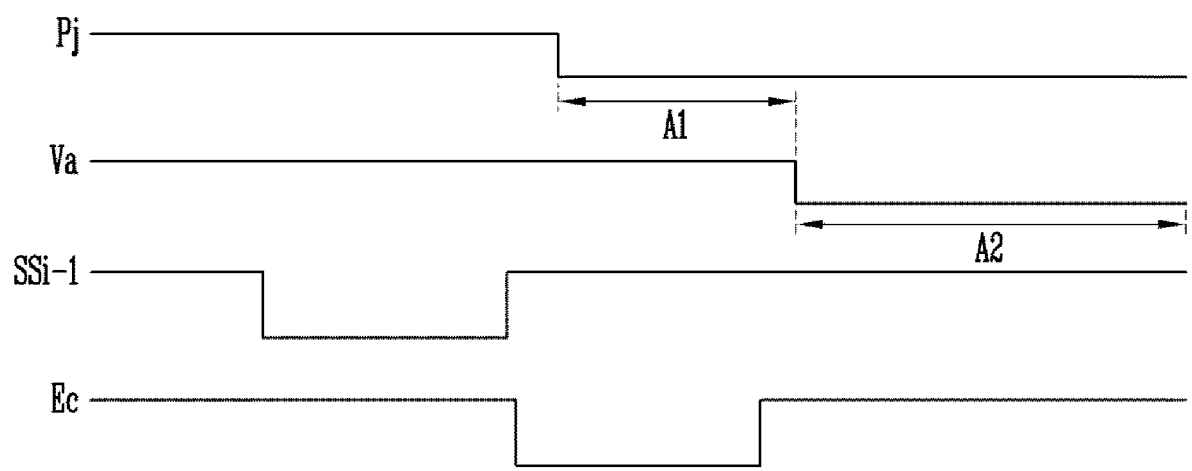
FIG. 13 is a waveform diagram for explaining an aging operation of the unit sensor pixel of FIG. 12, according to one or more exemplary embodiments.

FIG. 12 is an equivalent circuit diagram of an illustrative unit sensor pixel of FIG. 9, according to one or more exemplary embodiments. FIG. 13 is a waveform diagram for explaining an aging operation of the unit sensor pixel of FIG. 12, according to one or more exemplary embodiments. In FIG. 12, for descriptive and illustrative convenience, a sensor pixel SP' coupled to an i-th sensor scan line SSi and a j-th output line Oj is illustrated and will be described in association with FIGS. 1 and 2A. Also, the sensor pixel SP' may be similar to the sensor pixel SP of FIG. 10. As such, duplicative descriptions will be primarily omitted to avoid obscuring exemplary embodiments.

Referring to FIG. 12, the sensor pixel SP' may further include a fourth transistor T4. That is, the sensor circuit 140' may further include the fourth transistor T4.

The fourth transistor T4, which is an aging transistor for aging the third transistor T3, is intended to reduce the gate-induced drain leakage (GIDL) current of the third transistor T3. The fourth transistor T4 may be coupled between an auxiliary voltage line Va and the fourth node N4. For example, the fourth transistor T4 may include a first electrode coupled to the auxiliary voltage line Va, a second electrode coupled to the fourth node N4, and a gate electrode coupled to an aging control line Ec. In other words, the second electrode of the fourth transistor T4 may be coupled at the fourth node N4 in common to the sensor electrode 130, the gate electrode of the first transistor T1, and the second electrode of the third transistor T3.

Referring to FIG. 13, during a first period A1, a low-level aging control signal is provided, so that the fourth transistor T4 may remain turned on, the reference voltage Vcom of the j-th reference voltage line Pj may be maintained at a low level (e.g., about −7 V), and the voltage of the auxiliary voltage line Va may be maintained at a high level (e.g., about 6 V). As such, since a low-level voltage is applied to the first electrode of the third transistor T3, and a high-level voltage is applied to the second electrode of the third transistor T3, the third transistor T3 may be aged during the first period A1. Further, during a second period A2, the voltage of the auxiliary voltage line Va is maintained at a low level (e.g., about −7 V), the aging of the fourth transistor T4 may be additionally performed.

The operation of aging the fourth transistor T4 may be performed in a product lighting test, and may also be performed either in a specific situation (e.g., in power on/off situations) or at regular periods when each product is used. Furthermore, the aging control line Ec may be implemented as the i-th sensor scan line SSi.

Figure 14:
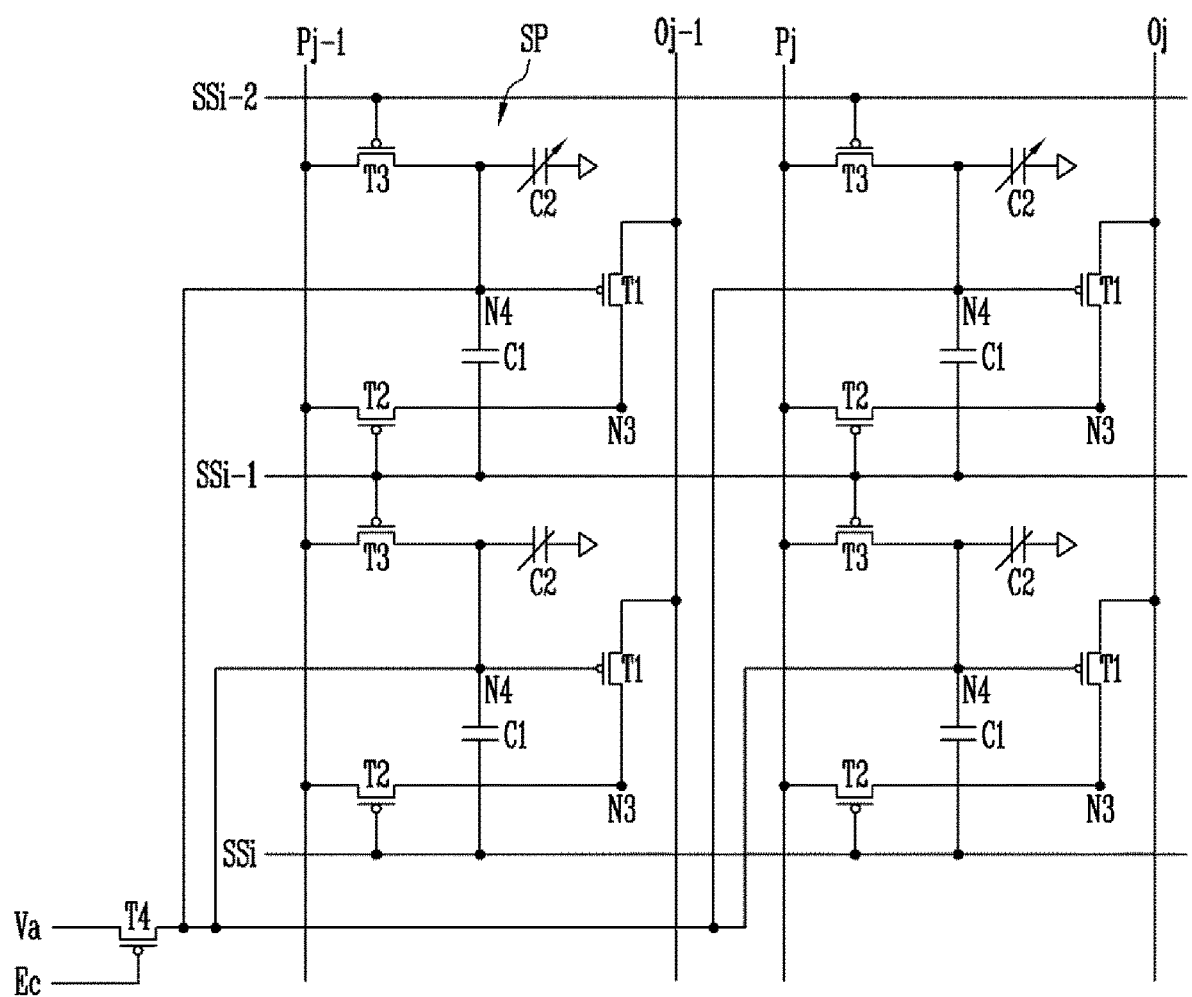
FIG. 14 is an equivalent circuit diagram in which a plurality of unit sensor pixels share a common aging transistor, according to one or more exemplary embodiments.

FIG. 14 is an equivalent circuit diagram in which a plurality of unit sensor pixels share a common aging transistor, according to one or more exemplary embodiments. The equivalent circuit diagram of FIG. 14 may be similar to those described in association with FIGS. 10 and 12. As such, duplicative descriptions will be primarily omitted to avoid obscuring exemplary embodiments Referring to FIG. 14, the plurality of sensor pixels SP may share a single aging transistor (e.g., a fourth transistor T4). For this operation, the fourth transistor T4 may be coupled in common between an auxiliary voltage line Va and the sensor electrodes 130 of the plurality of sensor pixels SP. For example, the first electrode of the fourth transistor T4 may be coupled to the auxiliary voltage line Va, and the second electrode of the fourth transistor T4 may be coupled in common to the fourth nodes N4 of the sensor pixels SP. In this manner, the number of transistors may be reduced as compared to a case where respective sensor pixels SP are provided with respective fourth transistors T4. As such, manufacturing costs and the number of manufacturing processes may be reduced.

FIGS. 15A, 15B, 15C, 15D, and 15E are diagrams of a display device at various stages of manufacture, according to one or more exemplary embodiments. In particular, FIGS. 15A to 15E illustrate a method of manufacturing a display device related to FIG. 2A.

Figure 15A:
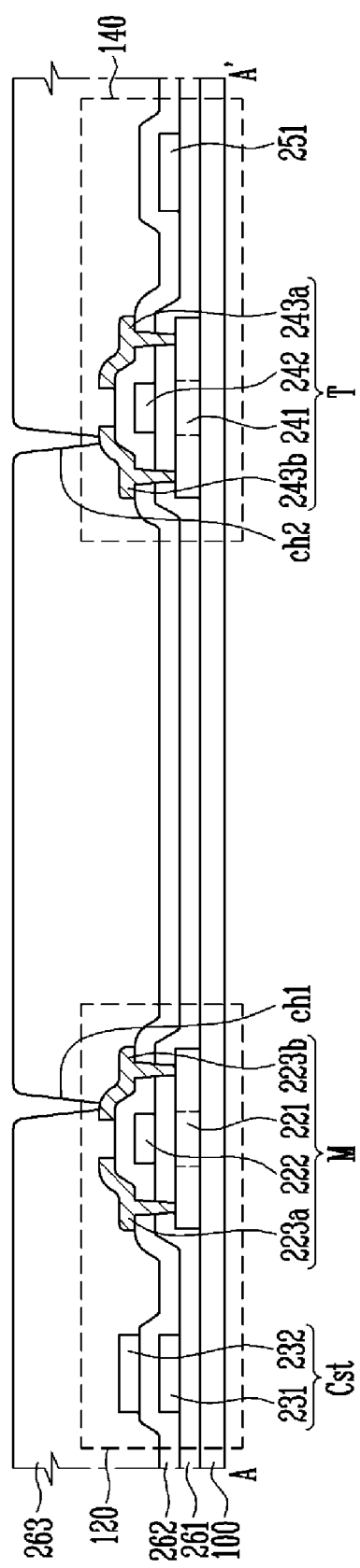

Referring to FIG. 15A, the step of forming a pixel circuit 120 and a sensor circuit 140 on a substrate 100 may be performed. Further, a planarization layer 263 may be formed on the pixel circuit 120 and the sensor circuit 140. A first contact hole ch1 and a second contact hole ch2 may be formed in the planarization layer 263 via an etching process.

Figure 15B:
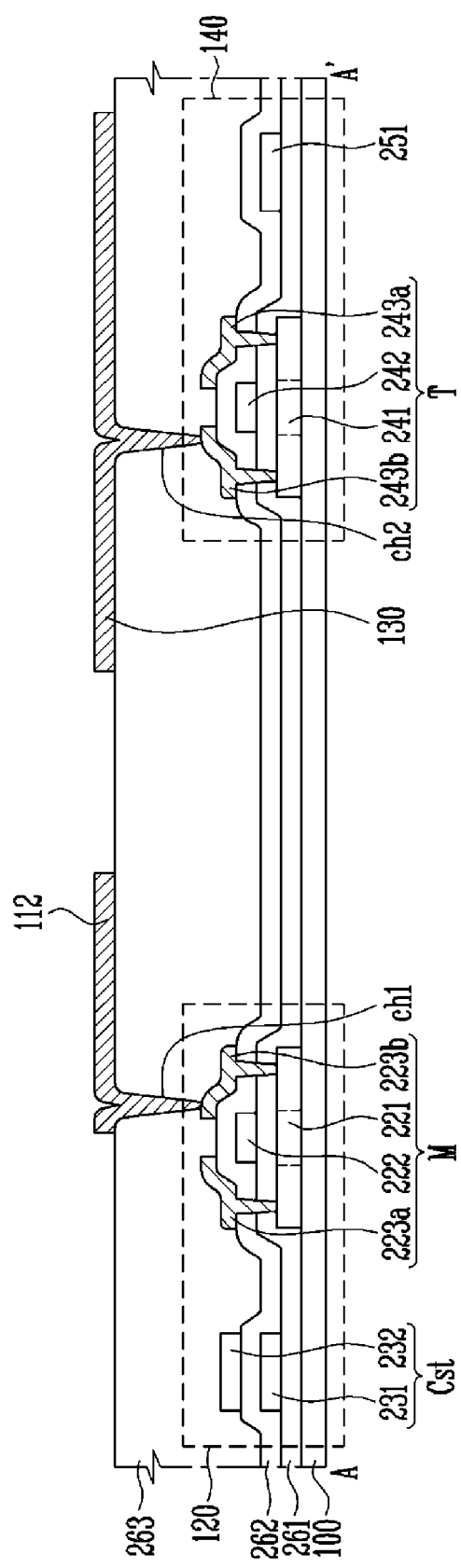

Referring to FIG. 15B, a second pixel electrode 112 and a sensor electrode 130 may be formed on the planarization layer 263. The second pixel electrode 112 and the sensor electrode 130 may be formed using the same process.

Figure 15C:
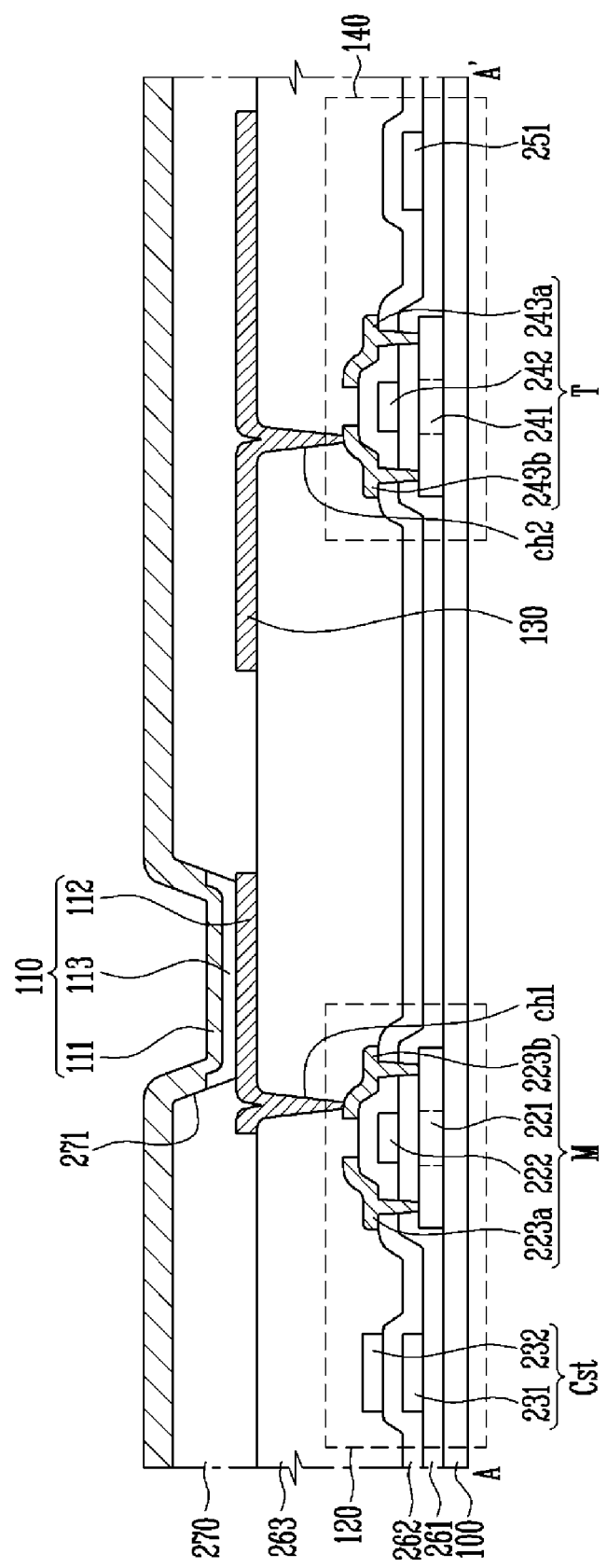

Referring to FIG. 15C, a pixel definition layer 270 may be formed on the second pixel electrode 112 and the sensor electrode 130, and an opening 271 for enabling a part of the second pixel electrode 112 to be exposed may be formed in the pixel definition layer 270. Also, the step of forming a light-emitting element 110 may be performed in such a way that a light-emitting layer 113 is formed on the second pixel electrode 112 and a first pixel electrode 111 is formed on the light-emitting layer 113. The first pixel electrode 111 may overlap the sensor electrode 130 and the sensor circuit 140 of a sensor pixel SP, as well as overlap the second pixel electrode 112 and the pixel circuit 120 of a display pixel DP.

Referring to FIG. 15D, the step of forming a first opening 291 in a partial region of the first pixel electrode 111 using laser radiation may be performed. The first opening 291 may be formed in a partial region of the first pixel electrode 111 that overlaps the sensor electrode 130. When a part of the first pixel electrode 111 is eliminated through a laser etching (or drilling) process, damage to the light-emitting element 110 may be minimized.

Figure 15E:
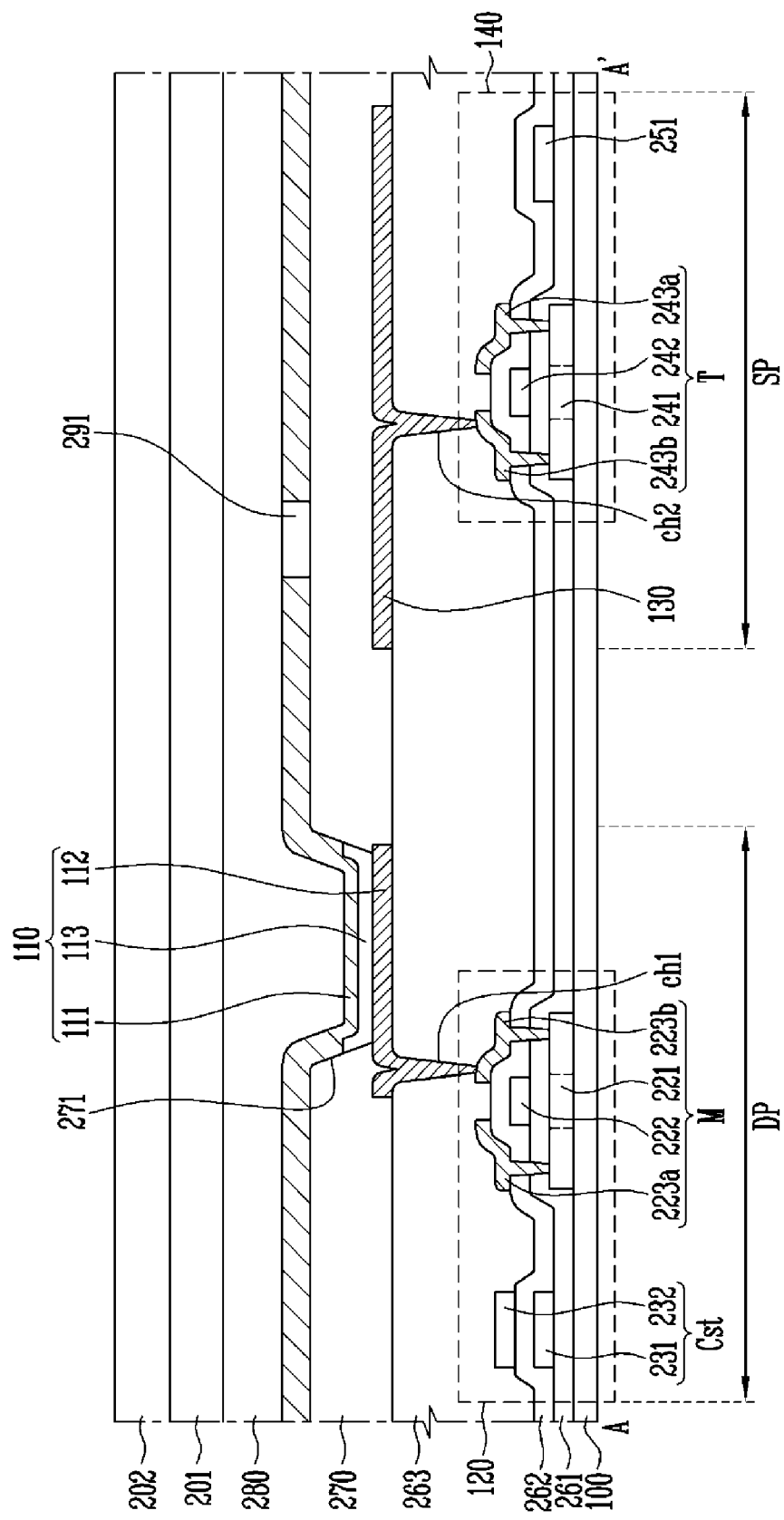

Referring to FIG. 15E, the step of forming an encapsulation layer 280, a polarization layer 201, and a window 202 on the first pixel electrode 111 may be performed.

FIGS. 16A, 16B, 16C, 16D, 16E, and 16F are diagrams of a display device at various stages of manufacture, according to one or more exemplary embodiments. In particular, FIGS. 16A to 16F illustrate a method of manufacturing a display device related to FIG. 4A.

Figure 16A:
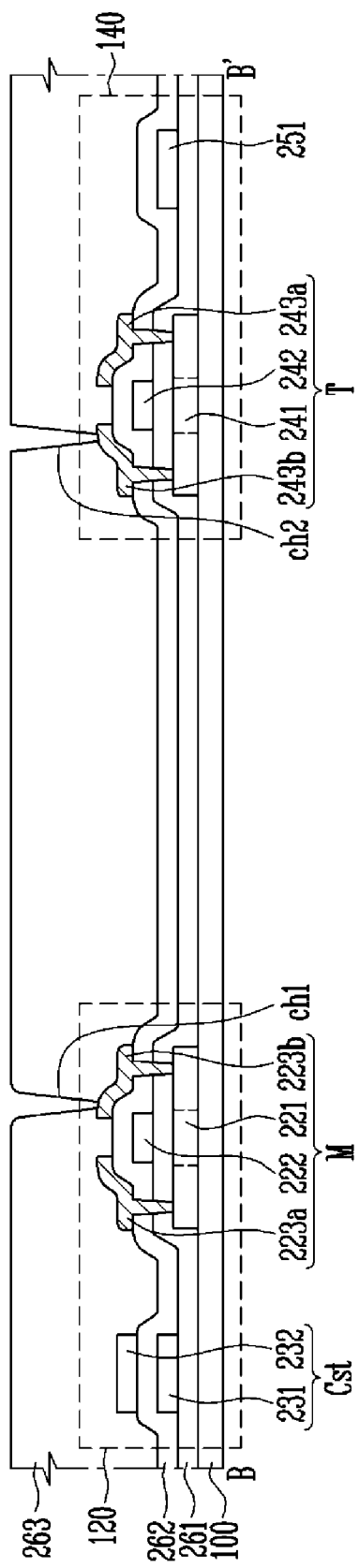

Referring to FIG. 16A, the step of forming a pixel circuit 120 and a sensor circuit 140 on a substrate 100 may be performed. Further, a planarization layer 263 may be formed on the pixel circuit 120 and the sensor circuit 140. A first contact hole ch1 and a second contact hole ch2 may be formed in the planarization layer 263 through an etching process.

Figure 16B:
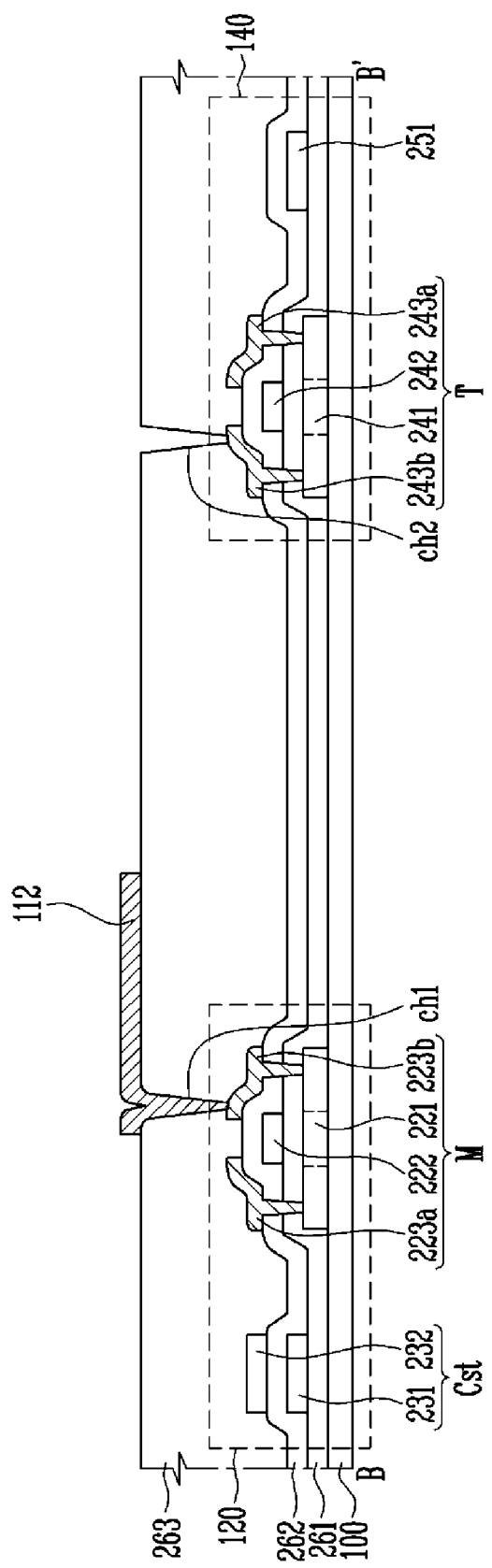

Referring to FIG. 16B, a second pixel electrode 112 may be formed on the planarization layer 263.

Figure 16C:
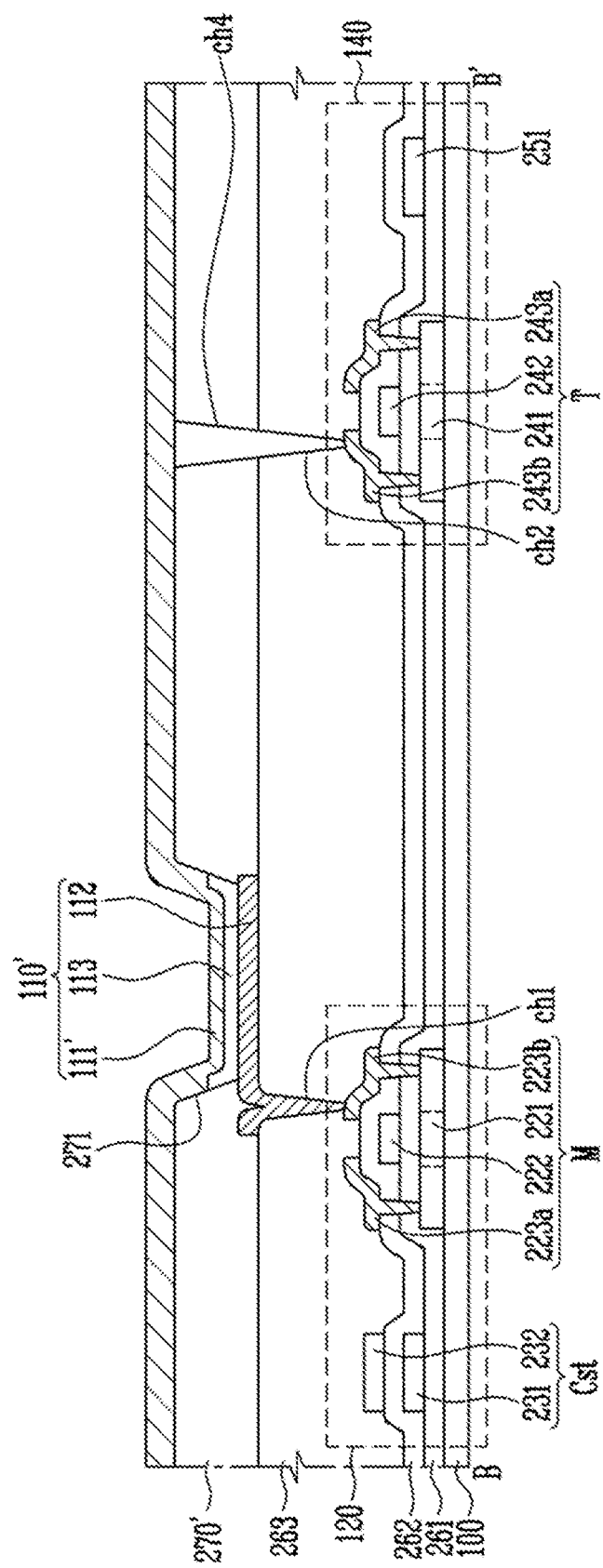

Referring to FIG. 16C, a pixel definition layer 270' may be formed on the second pixel electrode 112, and an opening 271 for enabling a part of the second pixel electrode 112 to be exposed may be formed in the pixel definition layer 270'. Further, a fourth contact hole ch4 may be formed in the pixel definition layer 270'. Also, the step of forming a light-emitting element 110' may be performed in such a way that a light-emitting layer 113 is formed on the second pixel electrode 112, and a first pixel electrode 111' is formed on the light-emitting layer 113. The first pixel electrode 111' may overlap the sensor circuit 140 of a sensor pixel SP', as well as the second pixel electrode 112 and the pixel circuit 120 of a display pixel DP.

Figure 16D:
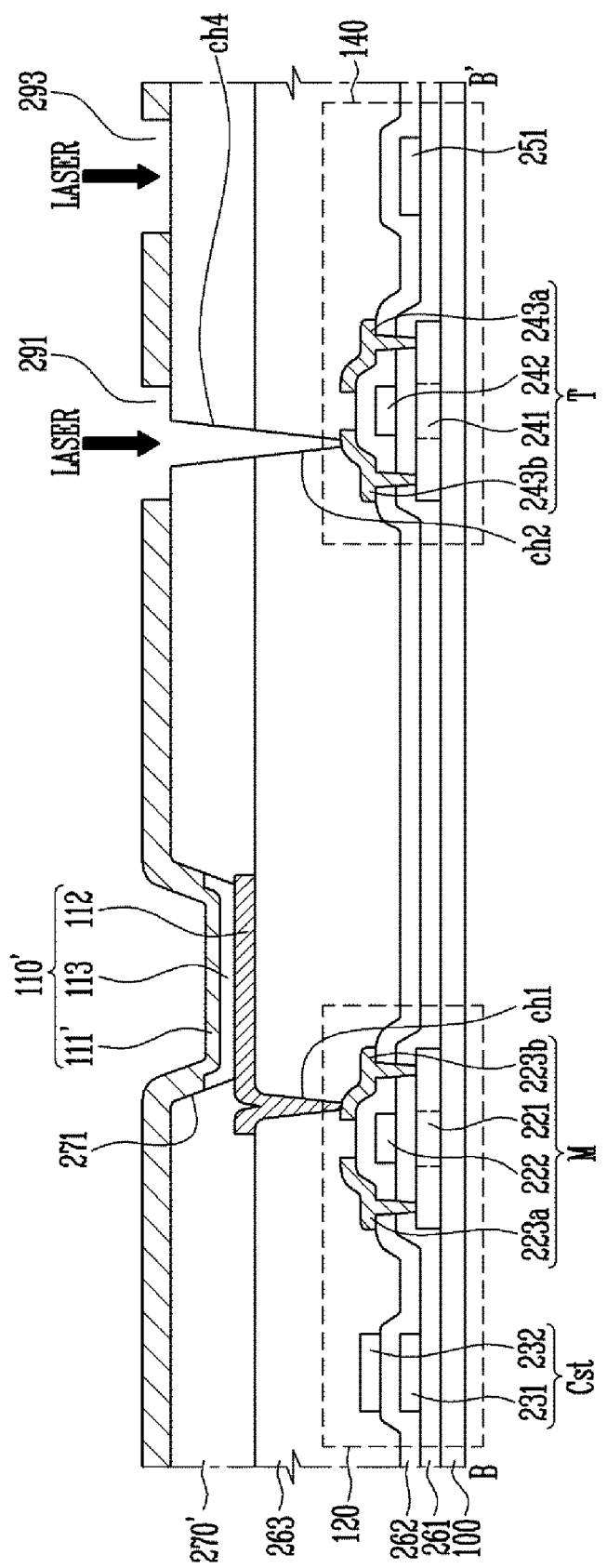

Referring to FIG. 16D, the step of forming a first opening 291 and a second opening 293 in a partial region of the first pixel electrode 111' using laser radiation may be performed. The first opening 291 and the second opening 293 may be formed in a partial region of the first pixel electrode 111' that overlaps the sensor circuit 140. It is also noted that the first opening 291 may overlap the fourth contact hole ch4 formed in the pixel definition layer 270' and the second contact hole ch2 formed in the planarization layer 263. It is also contemplated that when contact holes ch2 and ch4 are not formed in the planarization layer 263 and the pixel definition layer 270' at a previous process step, the first opening 291 and the contact holes ch2 and ch4 may also be formed together by radiating laser light at a current laser etching process step.

Figure 16E:
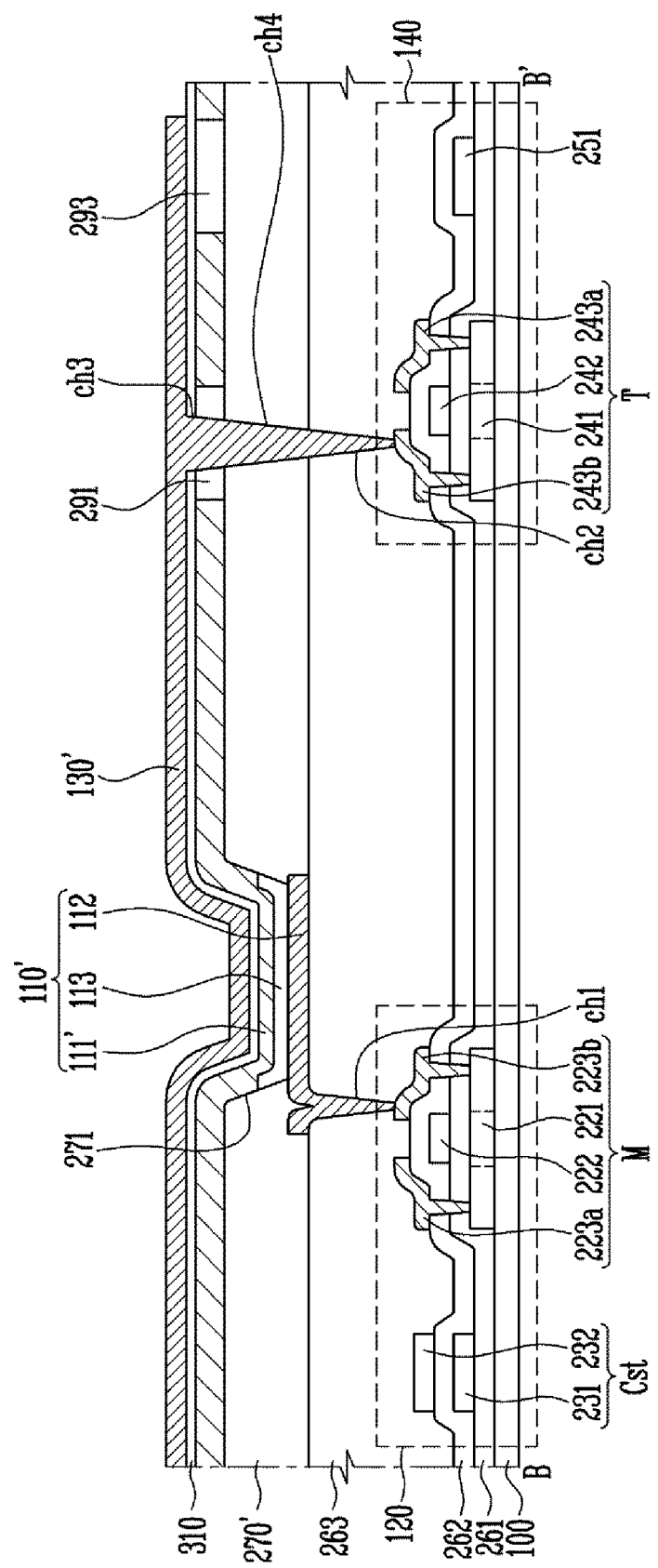

Referring to FIG. 16E, an insulating layer 310 may be formed on the first pixel electrode 111' and a third contact hole ch3 may be formed in the insulating layer 310. The third contact hole ch3 may be formed through a separate etching process, but it is also possible to form the first opening 291 and the contact holes ch2, ch3, and ch4 together by progressing a laser etching process after forming the insulating layer 310 on the first pixel electrode 111'. Also, the step of forming a sensor electrode 130' on the insulating layer 310 may be performed. As such, the sensor electrode 130' may be electrically coupled to the sensor circuit 140 through the third contact hole ch3 formed in the insulating layer 310, the first opening 291 formed in the first pixel electrode 111', the fourth contact hole ch4 formed in the pixel definition layer 270', and the second contact hole ch2 formed in the planarization layer 263.

Referring to FIG. 16F, the step of forming an encapsulation layer 280, a polarization layer 201, and a window 202 on the sensor electrode 130' may be performed.

FIGS. 17A, 17B, 17C, 17D, 17E, 17F, and 17G are diagrams of a display device at various stages of manufacture, according to one or more exemplary embodiments. In particular, FIGS. 17A to 17G illustrate a method of manufacturing a display device related to FIG. 6A.

Figure 17A:
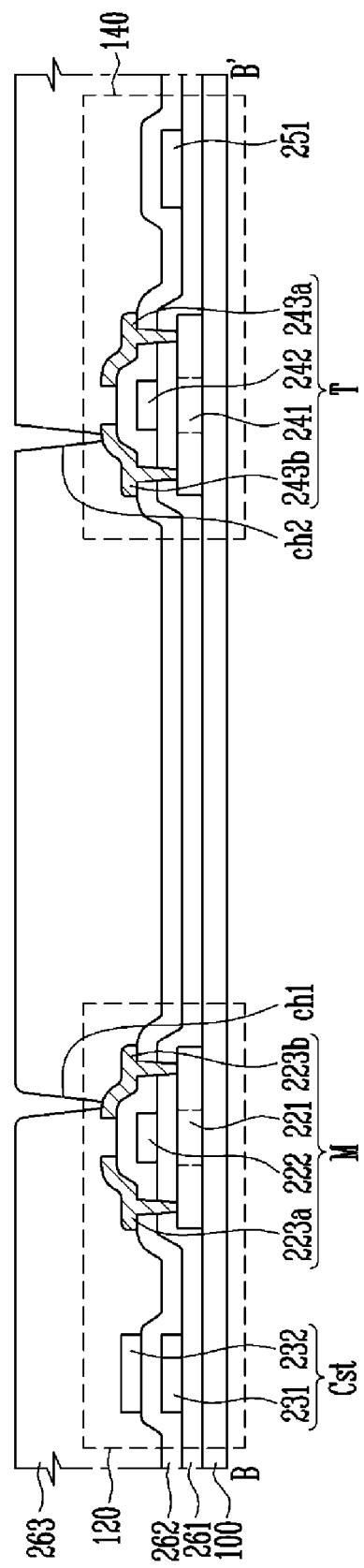

Referring to FIG. 17A, the step of forming a pixel circuit 120 and a sensor circuit 140 on a substrate 100 may be performed. Further, a planarization layer 263 may be formed on the pixel circuit 120 and the sensor circuit 140. A first contact hole ch1 and a second contact hole ch2 may be formed in the planarization layer 263 through an etching process.

Figure 17B:
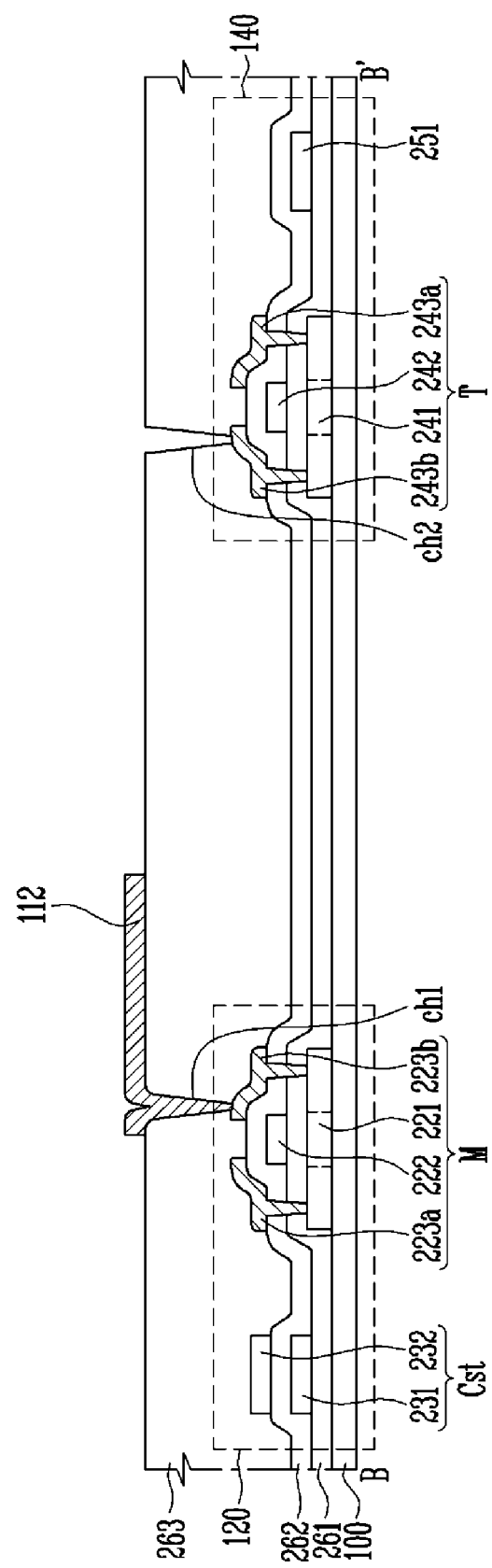

Referring to FIG. 17B, a second pixel electrode 112 may be formed on the planarization layer 263.

Figure 17C:
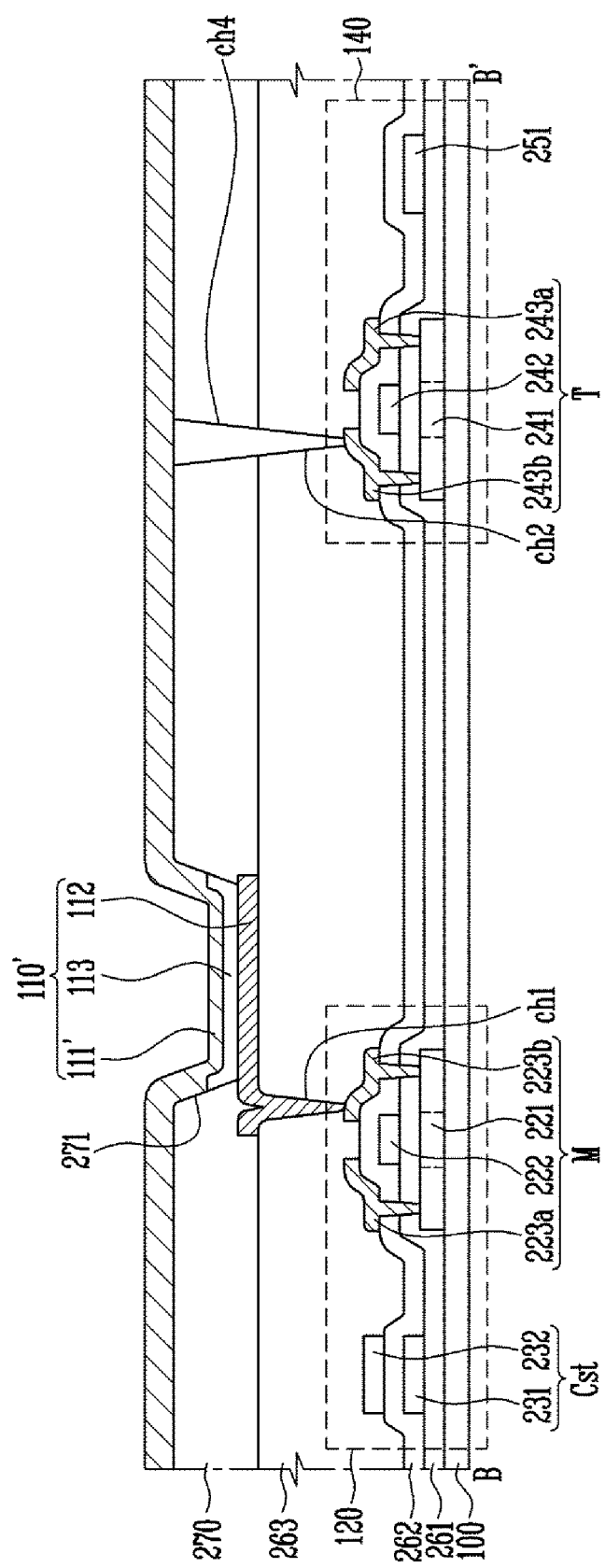

Referring to FIG. 17C, a pixel definition layer 270 may be formed on the second pixel electrode 112, and an opening 271 for enabling a part of the second pixel electrode 112 to be exposed may be formed in the pixel definition layer 270. Further, a fourth contact hole ch4 may be formed together with the opening in the pixel definition layer 270. Also, the step of forming a light-emitting element 110' may be performed in such a way that a light-emitting layer 113 is formed on the second pixel electrode 112 and a first pixel electrode 111' is formed on the light-emitting layer 113. The first pixel electrode 111' may overlap the sensor circuit 140 of a sensor pixel SP, as well as overlap the second pixel electrode 112 and the pixel circuit 120 of a display pixel DP.

Figure 17D:
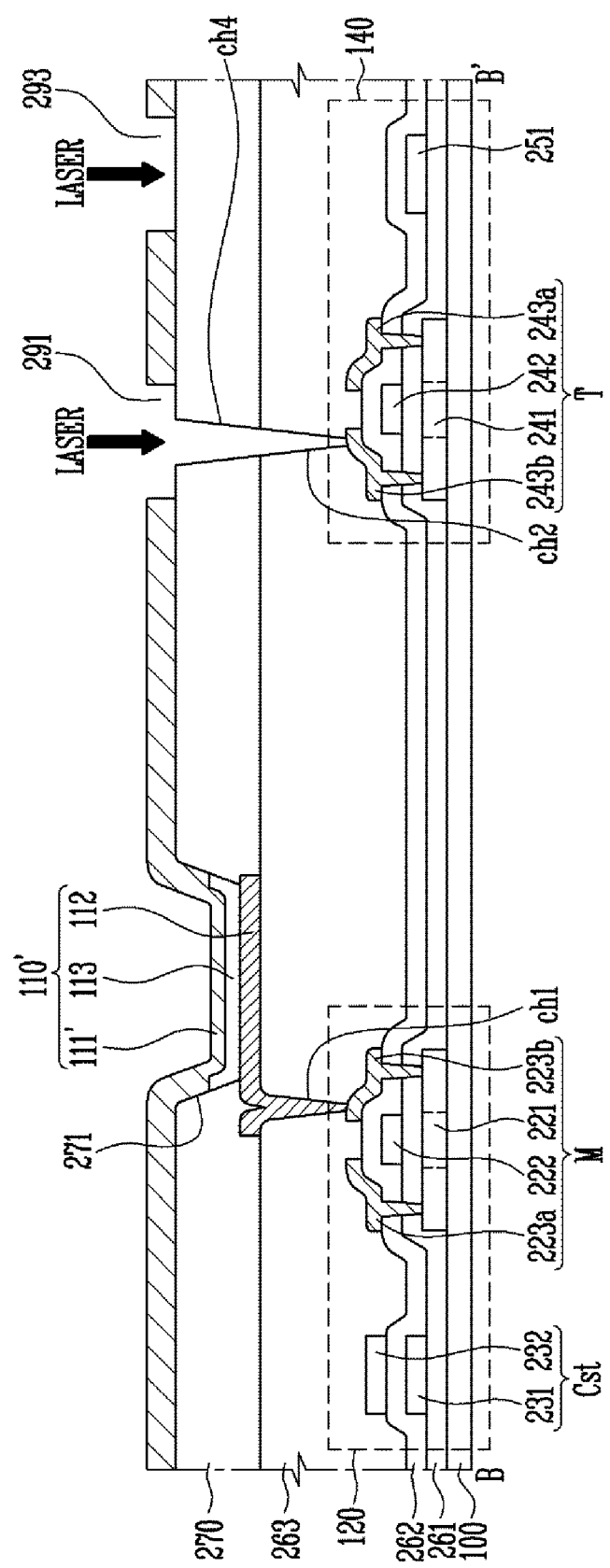

Referring to FIG. 17D, the step of forming a first opening 291 and a second opening 293 in a partial region of the first pixel electrode 111' using laser radiation may be performed. The first opening 291 and the second opening 293 may be formed in a partial region of the first pixel electrode 111', which overlaps the sensor circuit 140. Also, the first opening 291 may overlap the fourth contact hole ch4 formed in the pixel definition layer 270 and the second contact hole ch2 formed in the planarization layer 263. It is contemplated that when contact holes ch2 and ch4 are not formed in the planarization layer 263 and the pixel definition layer 270 at a previous process step, the first opening 291 and the contact holes ch2 and ch4 may be formed together by radiating laser light at a current laser etching process step.

Referring to FIG. 17E, an encapsulation layer 280 may be arranged on the first pixel electrode 111' and a sixth contact hole ch6 may be formed in the encapsulation layer 280. For example, when an inorganic layer and an organic layer are included in the encapsulation layer 280, the sixth contact hole ch6 may be formed by performing an etching process on the inorganic layer and performing a micro-printing process on the organic layer. Although the sixth contact hole ch6 may be formed through the above-described process, it is also possible to form the first opening 291 and the contact holes ch2, ch4, and ch6 together by progressing a laser etching process after forming the encapsulation layer 280 on the first pixel electrode 111'.

Figure 17F:
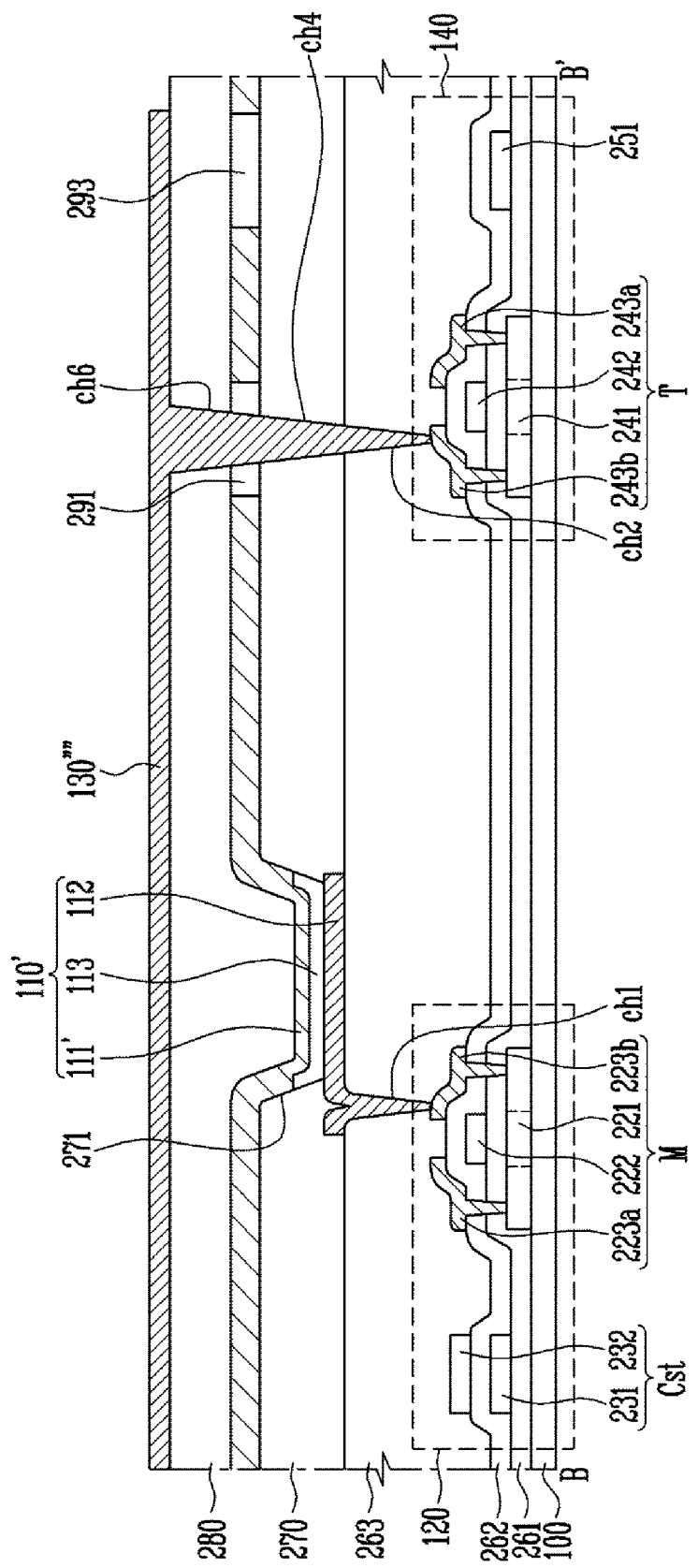

Referring to FIG. 17F, the step of forming a sensor electrode 130'''' on the encapsulation layer 280 may be performed. Accordingly, the sensor electrode 130'''' may be electrically coupled to the sensor circuit 140 through the sixth contact hole ch6 formed in the encapsulation layer 280, the first opening 291 formed in the first pixel electrode 111', the fourth contact hole ch4 formed in the pixel definition layer 270, and the second contact hole ch2 formed in the planarization layer 263.

Referring to FIG. 17G, the step of forming a polarization layer 201 and a window 202 on the encapsulation layer 280 may be performed.

According to one or more exemplary embodiments, a fingerprint sensor enabling fingerprint recognition may be provided. To this end, a display device may include the fingerprint sensor. Further, the fingerprint sensor may be manufactured when manufacturing the display device according to one or more of the aforementioned methods of manufacturing the display device. In accordance with one or more exemplary embodiments, the display device including the fingerprint sensor may be manufactured such that the number of manufacturing processes and manufacturing costs may be reduced.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device, comprising:
a display pixel comprising:
a pixel circuit;
a light-emitting element disposed on the pixel circuit, the light-emitting element comprising:
a second pixel electrode disposed on the pixel circuit, the second pixel electrode being electrically coupled to the pixel circuit; and
a first pixel electrode disposed on the second pixel electrode, the first pixel electrode overlapping, in a plan view, the second pixel electrode; and
a pixel definition layer disposed between the first pixel electrode and the second pixel electrode; and
a sensor pixel comprising:
a sensor electrode that, in the plan view, overlaps the first pixel electrode; and
a sensor circuit electrically coupled to the sensor electrode,
wherein:
the first pixel electrode comprises a first opening in a region that, in the plan view, overlaps the sensor electrode;
the first opening is, in the plan view, spaced part from the second pixel electrode; and
the pixel definition layer comprises a second opening that overlaps the first opening and exposes at least a portion of the second pixel electrode.

2. The display device according to claim 1, wherein the light-emitting element further comprises a light-emitting layer disposed between the first pixel electrode and the second pixel electrode.

3. The display device according to claim 2, wherein:
the first pixel electrode comprises a first portion that, in the plan view, overlaps the light-emitting layer and a second portion that, in the plan view, overlaps the sensor electrode; and
the first opening is formed in the second portion of the first pixel electrode.

4. The display device according to claim 1, wherein:
a portion of the first pixel electrode is disposed on the pixel definition layer; and
the sensor electrode overlaps the second pixel electrode in the plan view.

5. The display device according to claim 1, wherein:
a portion of the first pixel electrode is disposed on the pixel definition layer; and
the pixel definition layer covers the sensor electrode.

6. The display device according to claim 5, wherein materials of the sensor electrode and the second pixel electrode are equivalent.

7. The display device according to claim 6, wherein the sensor electrode and the second pixel electrode are disposed at a same layer.

8. The display device according to claim 5, wherein, in the plan view, the sensor electrode is spaced apart from the second pixel electrode.

9. The display device according to claim 5, further comprising:
an encapsulation layer that, in the plan view, overlaps the second pixel electrode.

10. The display device according to claim 1, wherein the first opening in the first pixel electrode comprises a laser-etched surface.

11. The display device according to claim 1, wherein the pixel circuit and the sensor circuit are disposed at a same layer or disposed at different layers.

12. The display device according to claim 1, wherein:
the pixel circuit is coupled to a display scan line and a data line; and
the pixel circuit is configured to:
receive a data signal via the data line; and
supply a drive current corresponding to the data signal to the light-emitting element.

13. The display device according to claim 1, wherein:
the sensor circuit is coupled to a first sensor scan line, a second sensor scan line, and an output line;
the sensor circuit is configured to output a current through the output line; and
a magnitude of the current output to the output line varies in response to a change in capacitance between the sensor electrode and a finger that, in the plan view, overlaps the sensor electrode.

14. The display device according to claim 13, wherein the sensor circuit comprises:
a first transistor comprising a gate electrode coupled to the sensor electrode, the first transistor being configured to control the current that is output through the output line;
a second transistor comprising a gate electrode coupled to the second sensor scan line and coupled between a reference voltage line and the first transistor;
a third transistor comprising a gate electrode coupled to the first sensor scan line and coupled between the reference voltage line and the sensor electrode; and
a capacitor electrode configured to form a capacitor with the sensor electrode, the capacitor electrode being coupled to the second sensor scan line.

15. The display device according to claim 14, wherein:
the sensor circuit further comprises a fourth transistor;
the fourth transistor comprises a gate electrode coupled to a sensor control line; and
the fourth transistor is coupled between an auxiliary voltage line and the sensor electrode.

16. The display device according to claim 14, wherein:
the sensor pixel comprises a plurality of sensor pixels; and
the display device further comprises a fourth transistor coupled in common between an auxiliary voltage line and sensor electrodes of the plurality of sensor pixels.

17. A display device, comprising:
a display pixel comprising:
a pixel circuit;
a light-emitting element disposed on the pixel circuit, the light-emitting element comprising:
a second pixel electrode disposed on the pixel circuit, the second pixel electrode being electrically coupled to the pixel circuit; and
a first pixel electrode disposed on the second pixel electrode, the first pixel electrode overlapping, in a plan view, the second pixel electrode; and
a sensor pixel comprising:
a sensor electrode that, in the plan view, overlaps the first pixel electrode; and
a sensor circuit electrically coupled to the sensor electrode,
wherein:
the first pixel electrode comprises a first opening in a region that, in the plan view, overlaps the sensor electrode;
the first opening is, in the plan view, spaced part from the second pixel electrode;
the sensor electrode overlaps with the second pixel electrode in the plan view; and
the sensor electrode is electrically coupled to the sensor circuit through the first opening in the first pixel electrode.

18. The display device according to claim 17, further comprising:
a pixel definition layer that, in the plan view, overlaps the pixel circuit and the sensor circuit
wherein:
the light-emitting element further comprises a light-emitting layer disposed between the first pixel electrode and the second pixel electrode;
the pixel definition layer comprises a second opening that exposes at least a portion of the second pixel electrode; and
a portion of the first pixel electrode is disposed on the pixel definition layer.

19. The display device according to claim 18, wherein:
the sensor circuit comprises a transistor and a capacitor electrode; and
the sensor electrode is electrically coupled to the transistor in the sensor circuit through the first opening in the first pixel electrode.

20. The display device according to claim 19, wherein:
the first pixel electrode further comprises a second opening in a region that, in the plan view, overlaps the capacitor electrode of the sensor circuit; and
the sensor electrode is electrically coupled to the capacitor electrode in the sensor circuit through the second opening in the first pixel electrode.

21. The display device according to claim 18, further comprising:
an encapsulation layer disposed on the first pixel electrode,
wherein a portion of the first pixel electrode is disposed between the pixel definition layer and the encapsulation layer, and
wherein a portion of the encapsulation layer is disposed between the sensor electrode and the first pixel electrode.

22. The display device according to claim 21, wherein the sensor electrode is electrically coupled to the sensor circuit through a contact hole in the encapsulation layer, the first opening in the first pixel electrode, and a contact hole in the pixel definition layer.

23. The display device according to claim 21, wherein the sensor electrode overlaps the display pixel in the plan view.

24. The display device according to claim 23, wherein the sensor electrode comprises a second opening that, in the plan view, overlaps the light-emitting layer.

25. The display device according to claim 17, further comprising:
an insulating layer disposed between the first pixel electrode and the sensor electrode.

26. The display device according to claim 17, wherein the sensor electrode overlaps the display pixel in the plan view.

27. The display device according to claim 26, wherein the sensor electrode comprises a third opening that overlaps the light-emitting layer in the plan view.

28. The display device according to claim 25, wherein the sensor electrode is electrically coupled to the sensor circuit through a contact hole in the insulating layer, the first opening in the first pixel electrode, and a contact hole in the pixel definition layer.

29. A fingerprint sensor, comprising:
sensor scan lines;
output lines; and
sensor pixels coupled to the sensor scan lines and the output lines,
wherein, among the sensor pixels, a sensor pixel coupled to an i-th ("i" being an integer of two or more) sensor scan line and an i−1-th sensor scan line, and a j-th ("j" being a natural number) output line comprises:
   a first transistor coupled between the j-th output line and a first node, the first transistor comprising a gate electrode coupled to a second node;
   a second transistor coupled between a reference voltage line and the first node, the second transistor comprising a gate electrode coupled to the i-th sensor scan line;
   a third transistor coupled between the second node and the reference voltage line, the third transistor comprising a gate electrode coupled to the i−1-th sensor scan line;
   a first capacitor coupled between the second node and the i-th sensor scan line; and
   a second capacitor coupled to the second node.

* * * * *